United States Patent
Yoon et al.

(10) Patent No.: US 9,401,348 B2
(45) Date of Patent: Jul. 26, 2016

(54) METHOD OF MAKING A SUBSTRATE STRUCTURE HAVING A FLEXIBLE LAYER

(71) Applicant: SAMSUNG ELECTRONICS CO., LTD., Suwon-si (KR)

(72) Inventors: Young Jeong Yoon, Suwon-si (KR); Yeon Woo Lee, Seoul (KR); Sung Min Jang, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/309,628

(22) Filed: Jun. 19, 2014

(65) Prior Publication Data

US 2015/0001557 A1 Jan. 1, 2015

(30) Foreign Application Priority Data

Jun. 28, 2013 (KR) .................. 10-2013-0076092

(51) Int. Cl.
| | |
|---|---|
| *H01L 33/46* | (2010.01) |
| *H01L 25/075* | (2006.01) |
| *H05K 1/02* | (2006.01) |
| *H05K 1/18* | (2006.01) |

(52) U.S. Cl.
CPC .......... *H01L 25/0753* (2013.01); *H05K 1/0204* (2013.01); *H05K 1/189* (2013.01); *H01L 2924/0002* (2013.01); *H05K 2201/066* (2013.01); *H05K 2201/10106* (2013.01)

(58) Field of Classification Search
CPC .. H01L 25/0753; H05K 1/0204; H05K 1/189; H05K 2201/066; H05K 2201/10106
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,857,767 B2 | 2/2005 | Matsui et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |

(Continued)

FOREIGN PATENT DOCUMENTS

| JP | 2005-276943 A | 10/2005 |
| JP | 2012-74148 A | 4/2012 |

(Continued)

*Primary Examiner* — Ermias Woldegeorgis
(74) *Attorney, Agent, or Firm* — Sughrue Mion, PLLC

(57) ABSTRACT

There is provided a semiconductor light emitting device including: a heat dissipation structure including one or more of materials among a metal, a ceramic, a semiconductor, and a resin; a flexible insulating layer directly in contact with the heat dissipation structure; a conductive layer laminated on the flexible insulating layer; and a light emitting device mounted on the conductive layer, wherein the light emitting device includes a light emitting structure including a first conductivity-type semiconductor layer, an active layer, and a second conductivity-type semiconductor layer; and first and second electrodes connected to the first and second conductivity-type semiconductor layers, respectively, and the first electrode includes a plurality of conductive vias connected to the first conductivity-type semiconductor layer through the second conductivity-type semiconductor layer and the active layer.

9 Claims, 27 Drawing Sheets

(56) References Cited

U.S. PATENT DOCUMENTS

| | | |
|---|---|---|
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 2001/0023779 A1* | 9/2001 | Sugaya et al. ............... 174/255 |
| 2005/0073044 A1* | 4/2005 | Tomabechi et al. .......... 257/720 |
| 2007/0139929 A1 | 6/2007 | Yoo et al. |
| 2009/0279300 A1 | 11/2009 | Okajima et al. |
| 2011/0228517 A1* | 9/2011 | Kawabat et al. ............... 362/84 |

FOREIGN PATENT DOCUMENTS

| | | |
|---|---|---|
| KR | 10-0955451 B1 | 4/2010 |
| KR | 10-2010-0073364 A | 7/2010 |
| KR | 10-0993252 B1 | 11/2010 |
| KR | 10-1022766 B1 | 3/2011 |
| KR | 10-1049887 B1 | 7/2011 |
| KR | 10-1074824 B1 | 10/2011 |
| KR | 10-1129707 B1 | 3/2012 |
| KR | 10-2011-0136527 A | 12/2012 |
| KR | 10-1228436 B1 | 1/2013 |

\* cited by examiner

| CHANNEL INFORMATION (CH) | WIRELESS NETWORK ID INFORMATION (PAN_ID) | DEVICE ADDRESS (Ded_Add) | SENSING DATA (ILLUMINATION INTENSITY VALUE, MOTION VALUE) |

METHOD OF MAKING A SUBSTRATE STRUCTURE HAVING A FLEXIBLE LAYER

CROSS-REFERENCE TO RELATED APPLICATIONS

This application claims the priority of Korean Patent Application No. 10-2013-0076092 filed on Jun. 28, 2013, with the Korean Intellectual Property Office, the disclosure of which is incorporated herein by reference.

BACKGROUND

1. Field

The present disclosure relates to a semiconductor light emitting device and a method for manufacturing a light source module.

2. Description of the Related Art

A light emitting diode (LED), a type of semiconductor light emitting element, is a semiconductor device capable of generating light of various colors according to the recombination of electrons and holes at p and n type semiconductor junctions when current is applied thereto. Compared with a filament-based light emitting element, the semiconductor light emitting element has various advantages such as a long lifespan, low power consumption, excellent initial driving characteristics, high vibration resistance, and the like, so demand for the semiconductor light emitting element continues to grow. Recently, as high output LED devices have been actively developed, LEDs have been employed in various fields of application, for example, as vehicle light sources, in electronic display boards, in illumination devices, as light sources for backlight units, and the like.

In particular, in a case in which an LED is used as a light source of a vehicle, the development of a light source module structure capable of guaranteeing design freedom according to vehicle designs and increasing heat dissipation efficiency is required.

SUMMARY

An aspect of the present disclosure provides a semiconductor light emitting device having excellent heat dissipation characteristics, having a high degree of design freedom, and being available for mass-production through a simple process, and a method for manufacturing a light source module.

In an exemplary embodiment, there is a light emitting device including: a solder resist layer; a first light source unit and a second light source unit disposed on the solder resist layer, the first and the second light source units being disposed in one region and another region, respectively; a conductive layer disposed below the solder resist layer; a flexible layer disposed below the conductive layer, the flexible layer being formed from a resin and one from among a ceramic filler and a light-reflective filler; and a first heat dissipation structure and a second heat dissipation structure, the first and the second heat dissipation structures being disposed below and in direct contact with the resin of the flexible layer, the first heat dissipation structure being disposed in the one region and the second heat dissipation structure being disposed in the other region; wherein a flexible region is disposed between the one region and the other region, and wherein the flexible layer is cured to bond the flexible layer and the heat dissipation structure together without using another layer or adhesive between the flexible layer and the first and the second heat dissipation structures.

The flexible layer may be cured to bond the flexible layer and the heat dissipation structure together by pressing the flexible layer and the heat dissipation structure together while applying heat to the flexible layer.

The flexible region may be flexible to have a convex shape and a concave shape or the flexible region is flexible to be bent so that the one region is at least perpendicular to the other region.

The flexible region may be flexible to have the convex shape and the concave shape.

The flexible region may be flexible to have one of the convex and the concave shapes at a part of the flexible region adjoining the one region and to have another of the convex and the concave shapes at a part of the flexible region adjoining the other region.

The solder resist layer, the conductive layer, and the flexible layer, may be contiguous through the one, the other, and the flexible regions.

The one, the other, and the flexible regions may form a stepped shape.

The ceramic filler may be less than 10% by weight of the flexible layer.

The flexible layer may have a thickness in a range from 0.1 micrometer to 0.15 micrometer.

The flexible region may be flexible to be bent so that the one region is at least perpendicular to the other region.

A planar surface of the one region may be perpendicular to a planar surface of the other region.

In an exemplary embodiment, there is a method of making a light emitting device, the method including: attaching a conductive layer on an upper surface of a flexible layer, the flexible layer being made of a resin and one from among a ceramic filler and a light-reflective filler, and being maintained in a semi-cured state; forming a solder resist layer on the conductive layer; attaching a heat dissipation structure to a lower surface of the flexible layer, the attached heat dissipation structure being in direct contact with the resin of the flexible layer; and heating and pressing to bond the flexible layer and the heat dissipation structure together.

The attaching the heat dissipation structure may be first attaching a first heat dissipation structure to one region of the flexible layer, the method further including second attaching a second heat dissipation structure to another region of the flexible layer.

The flexible region may be disposed between the one and the other regions, and includes portions of the solder resist layer, the conductive layer, and the flexible layer, and wherein the flexible region is flexible to have one of a positive curvature and a negative curvature at a part of the flexible region adjoining the one region and to have another of the positive curvature and the negative curvature at a part of the flexible region adjoining the other region.

In the heating and pressing, the flexible layer in the semi-cured state, may be cured to bond the flexible layer and the heat dissipation structure together without using another layer or adhesive between the flexible layer and the heat dissipation structure.

The heating and pressing may include: heating to a temperature between 140° C. and 190° C.; and applying pressure between 5.5 KG/F to 7.5 KG/F.

The heating and applying pressure may be applied for two to six hours to cure the semi-cured flexible layer.

The temperature of the heating may be between 140° C. and less than 180° C.

The ceramic filler may be 10% by weight of the flexible layer.

The flexible layer may have a thickness in a range from 0.1 micrometer to 0.15 micrometer.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF EXEMPLARY EMBODIMENTS

Figure 1:
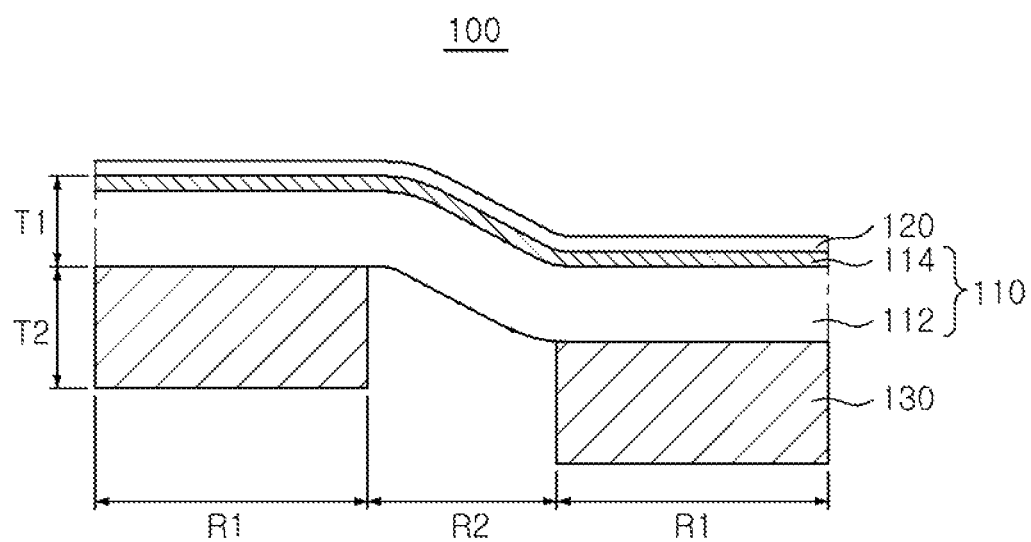
FIG. 1 is a cross-sectional view schematically illustrating a substrate according to an embodiment of the present inventive concept.

Hereinafter, embodiments of the present disclosure will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

FIG. 1 is a cross-sectional view schematically illustrating a substrate according to an embodiment of the present inventive concept;

Referring to FIG. 1, a substrate unit 100 includes a flexible structure 110, a solder resist layer 120, and a heat dissipation structure 130. Also, the substrate unit 100 may have first regions R1 and a second region R2 adjacent to each other. The first regions R1 may be device regions in which an electronic component, e.g., a light source, is mounted, on the substrate unit 100, and the second region R2 may be disposed between adjacent first regions R1 and may be a flexible region which is easily bendable. However, the amount and disposition of the first regions R1 and the second region R2 may not be limited thereto and may be variously modified, and only the first regions R1 may be provided according to an embodiment.

In an exemplary embodiment, the second region R2 is a flexible region that is flexible to have a convex shape and then a concave shape as the second region R2 flexes from about where the first and second regions R1 and R2 meet toward the middle of the second region R2. In one exemplary embodiment, the curvature from the first region R1 to the second region R2, the curvature at the second region R2, and the curvature from the second region R2 to the first region R1 are a negative curvature, positive curvature, and negative curvature, respectively. In yet another exemplary embodiment, the second region R2 is bent so that one of the first region R1 may be at an angle that is substantially perpendicular to another of the first region R1. The angle may be at least 90 degrees. In this exemplary embodiment, the second region R2 would assume only one of a convex or a concave shape. Alternatively, the second region R2 may be bent in an angular manner, as shown below.

In an exemplary embodiment, the solder resist layer 120, the conductive layer 114, and the flexible structure 110, are contiguous through the first and the second regions R1 and R2.

The flexible structure 110 may be a film formed by laminating a flexible insulating layer 112 and a conductive layer 114.

The flexible insulating layer 112 may include an insulating resin having excellent flexibility (or ductility). For example, the flexible insulating layer 112 may be made of a mixture obtained by mixing a ceramic filler or a light-reflective filler with an organic resin containing epoxy, triazine, silicon, or the like. In this case, the ceramic filler may serve to lower a coefficient of thermal expansion of the epoxy resin. In an exemplary embodiment, the ceramic filler may be 10% by weight of the flexible insulating layer 112.

The conductive layer 114 may include a conductive material such as a metal. For example, the conductive layer 114 may be configured as a resin coated copper (RCC) foil. In this case, the conductive layer 114 may have a structure in which an epoxy resin having a thickness ranging from 50 μm to 80 μm is coated on a copper (Cu) layer having a thickness ranging from 5 μm to 70 μm. According to an embodiment, the flexible structure 110 itself may be formed as an RCC foil. Although not shown, the conductive layer 114 may be a patterned layer.

Meanwhile, the flexible insulating layer 112 and the conductive layer 114 constituting the flexible structure 110 may have excellent flexibility, relative to the heat dissipation structure 130. Also, the flexible structure 110 may not include a polyimide layer generally used in a Flexible Printed Circuit Board (FPCB) or may have a polyimide layer having a relatively reduced thickness, so it has low tension, thus having excellent flexibility.

The solder resist layer 120 may be disposed on the flexible structure 110 and cover the pattern of the conductive layer 114 to prevent undesired connections when an electronic component is mounted, thus protecting the conductive layer 114 and providing insulating properties between circuits formed by the pattern of the conductive layer 114. The solder resist layer 120 may be made of a photosensitive resin, for example. Although not shown, the solder resist layer 120 may be a layer patterned to expose the conductive layer 114 in at least a partial region thereof.

The heat dissipation structure 130 may be disposed on one surface of the flexible structure 110 in the first regions R1. The heat dissipation structure 130 may be made of a material having excellent heat conductivity. For example, the heat dissipation structure 130 may be made of one or more of a metal consisting of silver (Ag), aluminum (Al), nickel (Ni), chromium (Cr), copper (Cu), gold (Au), palladium (Pd), platinum (Pt), tin (Sn), tungsten (W), rhodium (Rh), Iridium (Ir), ruthenium (Ru), magnesium (Mg), zinc (Zn), titanium (Ti), or an alloy material including the same, ceramics, semiconductor such as silicon (Si), germanium (Ge), or the like, and a resin. In particular, the heat dissipation structure 130 may be made of a metal having a high degree of heat conductivity. Thus, the heat dissipation structure 130 may serve to dissipate heat generated by an electronic component mounted in the first regions R1 downwardly, i.e., in a downward direction (toward bottom of drawing). Also, the heat dissipation structure 130 is not formed in the second region R2, so flexibility of the substrate unit 110 in the second region R2 may be maintained.

The flexible structure 110 may have a first thickness T1, and the heat dissipation structure 130 may have a second thickness T2 greater than the first thickness T1. The first thickness T1 may range from 0.1 μm to 0.15 μm, for example. However, the first thickness T1 may be similar to the second thickness T2 according to an embodiment. The heat dissipation structure 130, i.e., the area of the first regions R1, may be designed to various sizes, but it is advantageous, in terms of heat dissipation, for the heat dissipation structure 130 to have an area equal to or greater than at least one of the area of the flexible structure 110 laminated thereon and the area of a light emitting device.

The flexible insulating layer 112 may be disposed between the conductive layer 114 and the heat dissipation structure 130 such that the flexible insulating layer 112 is directly in contact therewith without medium layers (e.g., intervening or middle layers) interposed in both junction interfaces. In other words, the surfaces of the flexible insulating layer 112 are directly in contact with the correspondingly facing surfaces of the conductive layer 114 and the heat dissipation structure 130 without medium layers interposed thereinbetween. This may mean that the flexible insulating layer 112 positioned between the both junction interfaces has a matrix having the same component system. For example, the flexible insulating layer 112 forming the entire region between the junction interfaces has a one component system matrix of an epoxy resin and the matrix may include a filter dispersed therein, without any medium layer of a different component system. In another example, the matrix of the flexible insulating layer 112 may be a two component system in which a different resin is mixed with the epoxy resin, rather than a one component system, and in this case, the entire region between both junction interfaces may be formed of the same two component system matrix.

According to an embodiment, a medium layer may not only be interposed in the interface between the flexible structure 110 and the heat dissipation structure 130, and the flexible structure 110 and the heat dissipation structure 130 may be disposed to be directly in contact.

The substrate unit 100 according to the present embodiment may include a small amount of layers such as three layers of the heat dissipation structure 130, the flexible insulating layer 112, and the conductive layer 114 or four layers of the heat dissipation structure 130, the flexible insulating layer 112, the conductive layer 114, and the solder resist layer 120, having a relatively small thickness ranging from 0.1 mm to 0.15 mm, to have heat dissipation characteristics. In addition, since the substrate unit 110 is formed of the smaller amount of layers, it may be formed to have a relatively small thickness and to have heat dissipation characteristics. Also, the degree of freedom of design using the substrate unit 100 may be enhanced by the second region R2 that is a flexible region.

Figure 2:
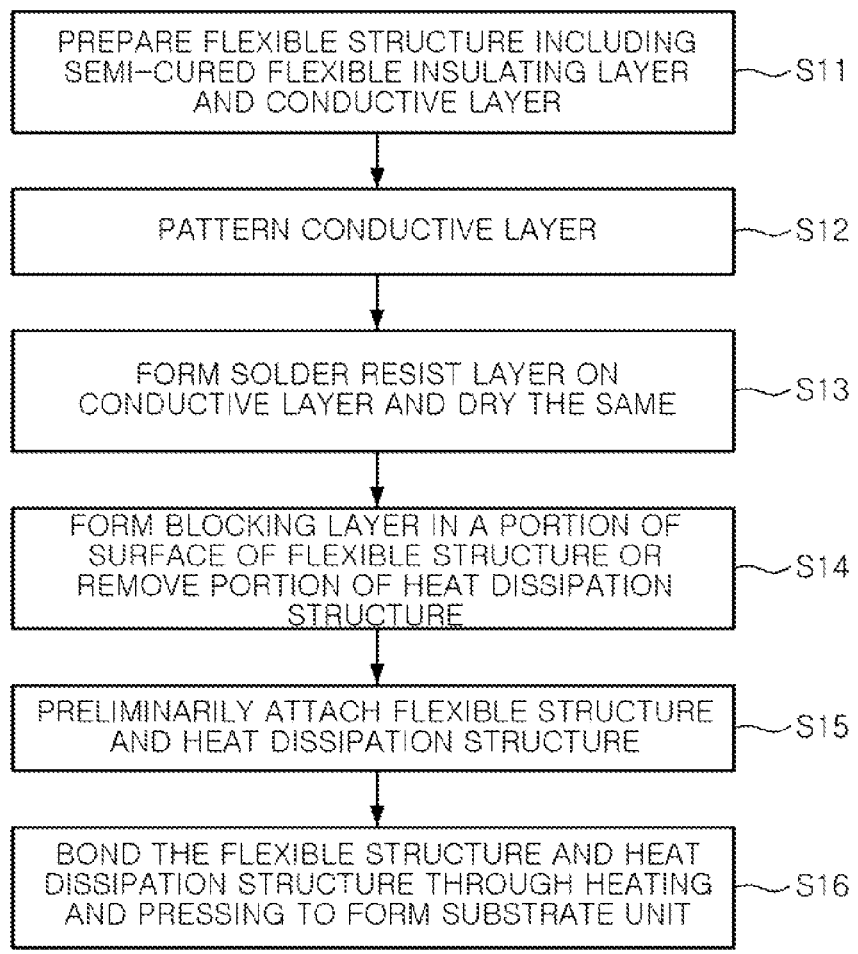
FIG. 2 is a flow chart illustrating a process of a method for fabricating a substrate structure according to an embodiment of the present inventive concept.

FIG. 2 is a flow chart illustrating a process of a method for fabricating a substrate structure according to an embodiment of the present inventive concept.

Figure 3A:
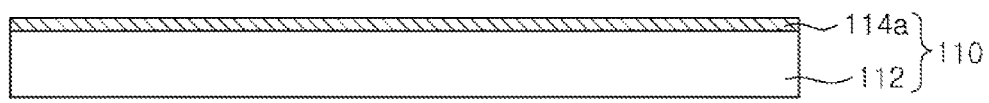
FIGS. 3A though 3H are views illustrating major stages of the method for fabricating a substrate according to an embodiment of the present inventive concept.

FIGS. 3A though 3H are views illustrating major stages of the method for fabricating a substrate according to an embodiment of the present inventive concept;

Referring to FIGS. 2 and 3A, the flexible structure 110 formed by laminating a conductive material layer 114a on the flexible insulating layer 112, is prepared in operation S11. In this operation, the flexible insulating layer 112 is maintained in a semi-cured state.

The term semi-cured state mentioned in the present disclosure refers to a state in which a material is not completely cured but is cured to a degree to which it can have handling performance or processibility. For example, in a curing reaction process, a resin in a completely cured state may be understood as being in a C stage state, and a resin in a semi-cured state may be understood as being in a B stage state. The resin material in the semi-cured state may be compressed to an object, while applying a predetermined degree of heat thereto, to have bonding strength in maintaining a strong bonding state.

A thickness of the flexible insulating layer 112 may be greater than that of the conductive material layer 114a, and the flexible structure 110 may be prepared to have a size in which a plurality of electronic components are mountable thereon according to a fabricated module.

Figure 3B:
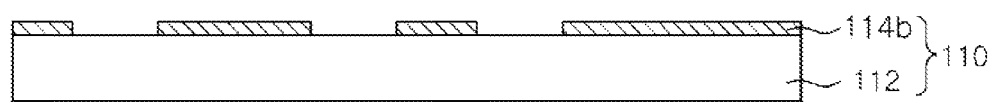

Referring to FIGS. 2 and 3B, the conductive material layer 114a may be patterned to form the conductive layer 114b in operation S12. The patterning process may include coating, exposing, and etching a dry film, and accordingly, the conductive layer 114b may only be formed in a desired region. The conductive layer 114b may form, for example, a circuit pattern to allow an electronic component mounted on the substrate unit 100 (see FIG. 1) to be connected to the outside.

Figure 3C:
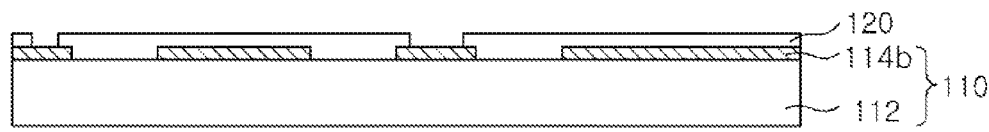

Referring to FIGS. 2 and 3C, first, the solder resist layer 120 may be formed on the flexible structure 110 in operation S13. The solder resist layer 120 may be formed by applying photo solder resist (PSR) ink, and exposing and developing the same. The PSR ink may be an insulating material including, for example, an epoxy resin, a thermosetting resin, a photo initiator, a filler, and the like. The PSR ink may be stirred for about 30 minutes, for example.

Next, the solder resist layer 120 on the flexible structure 110 may be dried. A temperature for drying the solder resist layer 120 may range from 70° C. to 90° C., and a drying time may range from 20 min. to 30 min. When the stirring time, the drying temperature, and the drying time are relatively short, cracks may be generated in the solder resist layer 120 in a follow-up process described below with reference to FIG. 3F.

Figure 3D:
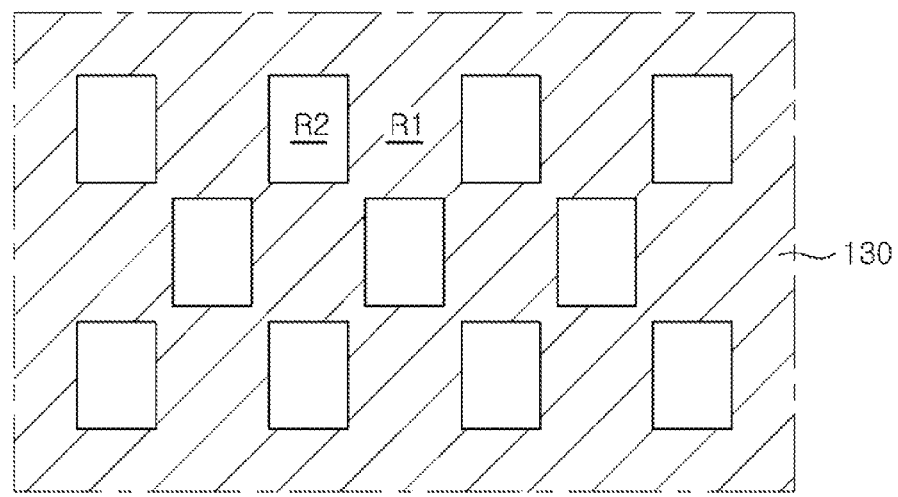
Figure 3E:
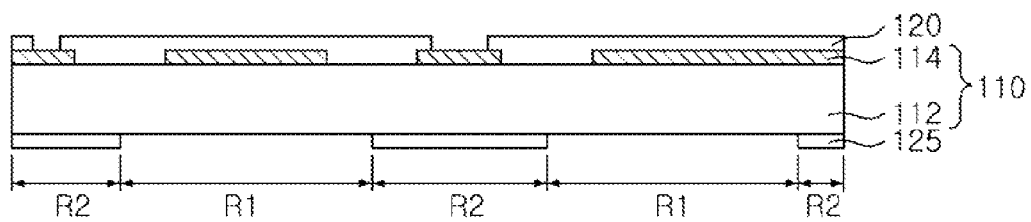

Referring to FIGS. 2, 3D, and 3E, a blocking layer may be formed in a portion of the surface of the flexible structure 110 or a portion of the heat dissipation structure 130 may be formed on the surface of the flexible structure 110 or removed therefrom in operation S14. The both operations may also be performed.

First, referring to FIG. 3D, a portion of the heat dissipation structure 130 may be blanked. The heat dissipation structure 130 may be prepared to have a size equal or similar to that of the flexible structure 110 of FIG. 3C to correspond thereto. Next, a blanking process may be performed on the heat dissipation structure 130 such that regions corresponding to the second region R2 are removed and only regions corresponding to the first regions R1 remain. The sizes and dispositions of the first regions R1 and the second regions R2 are not limited to those illustrated in FIG. 3D.

Thereafter, referring to FIG. 3E, a process of forming the blocking layer 125 on a lower surface of the flexible structure 110, i.e., on portions of the surface of the flexible insulating layer 112 may be performed. The blocking layer 125 may only be formed in the second regions R2. According to an embodiment, the blocking layer 125 may be formed on the lower surface of the flexible structure 110 and patterned to remain only in the second regions R2 in this operation.

According to an embodiment, the second regions R2 may not provided, and in this case, the foregoing process may be omitted.

Figure 3F:
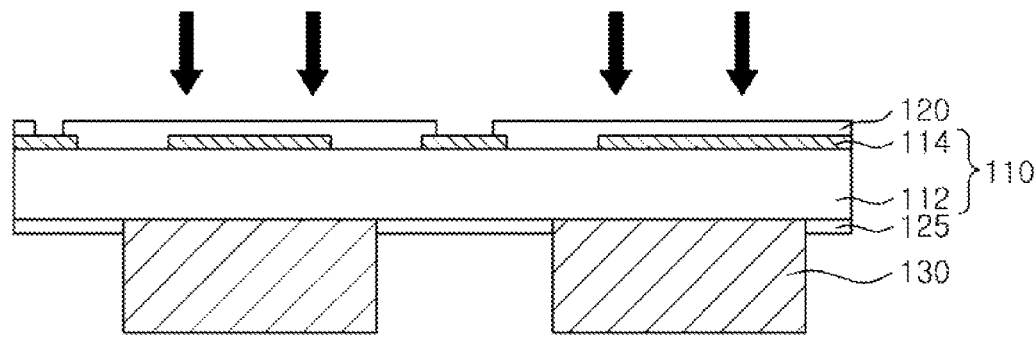

Referring to FIGS. 2 and 3F, the flexible structure 110 with the solder resist layer 120 formed thereon and the heat dissipation structure 130 are bonded in operations S15 and S16.

The bonding process may be performed such that the heat dissipation structure 130 is positioned in the first regions in which the blocking layer 125 is not present. The bonding process may include preliminarily attaching the flexible structure 110 with the solder resist layer 120 formed thereon and the heat dissipation structure 130; and curing and bonding the flexible structure 110 by applying heat and pressure thereto.

The bonding process based on curing may be performed at a temperature ranging from about 140° C. to 190° C. at pressure ranging from about 5.5 KG/F to 7.5 KG/F, for two to six hours, and as the flexible structure 110 in a semi-cured state is cured, it is bonded to the heat dissipation structure 130 to finally form the substrate unit 100 (FIG. 1). If a temperature and pressure are relatively high, the flexible structure 110 may be excessive cured and be damaged, and if a temperature and pressure are relatively low, the flexible structure 110 may not be easily bonded to the heat dissipation structure 130. According to the present embodiment, since bonding is performed with the flexible structure 110 in a semi-cured state, without a medium layer such as an adhesive, the process can be simplified.

The heat dissipation structure 130 is illustrated only in portions corresponding to the first regions R1, but as illustrated in FIG. 3D, the heat dissipation structure 130 is a single integrated plate-like film in which portions are connected to each other. Thus, since the flexible structure 110 and the heat dissipation structure 130 have the same external lines, they can be easily bonded through the bonding process.

Also, according to an embodiment, the flexible structure 110 may be bonded to a plate-like heat dissipation structure 130 or a bar-like heat dissipation structure 130 including only the first regions R1 without the second regions R2.

Figure 3G:
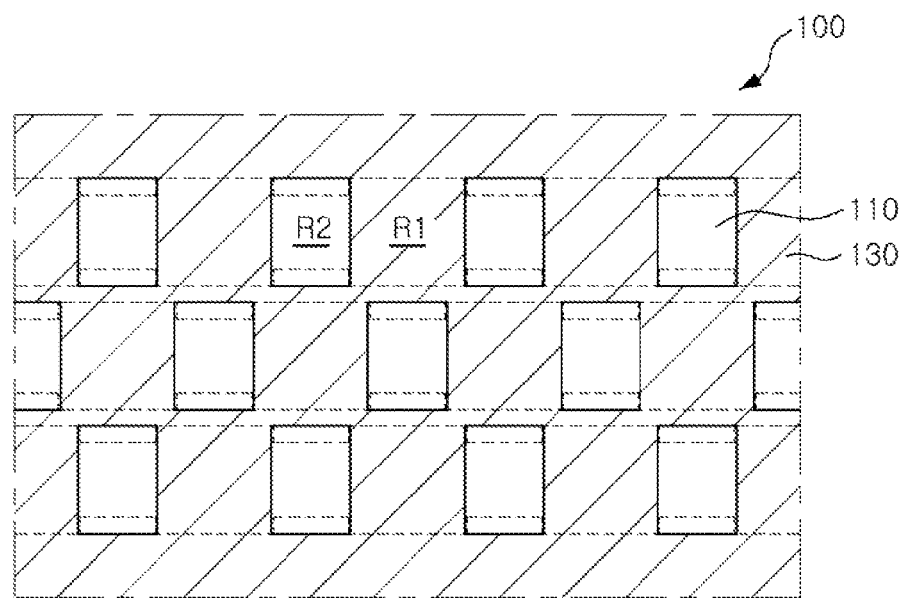

Referring to FIG. 3G, a bottom view of the substrate unit 100 is illustrated, and a process of cutting the substrate unit 100 may be performed.

The substrate unit 100 may be cut along the perforated line according to a size and shape of a product to which the substrate 100 is applied. For example, the substrate unit 100 may be cut such that the first regions R1 and the second regions R2 are alternately disposed in one direction. However, this process is optional and may be omitted.

Figure 3H:
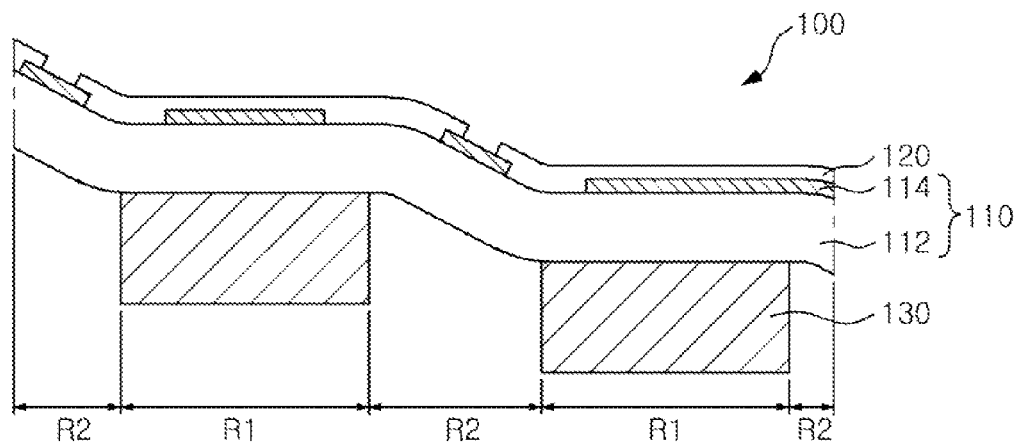

Referring to FIG. 3H, a process of bending the second regions R2 of the substrate unit 100 may be performed.

According to design of a module in which the substrate unit 100 is used, the bending process may be performed on at least a portion of the second regions R2 having excellent flexibility. Accordingly, the plurality of first regions R1 may have different levels, respectively. An angle at which the second regions R2 are bent may be variously modified according to an embodiment.

According to the present embodiment, the substrate 100 may include the second regions R2. While obtaining a heat dissipation function through the heat dissipation structure 130, a degree of freedom in design may be enhanced.

Figure 4:
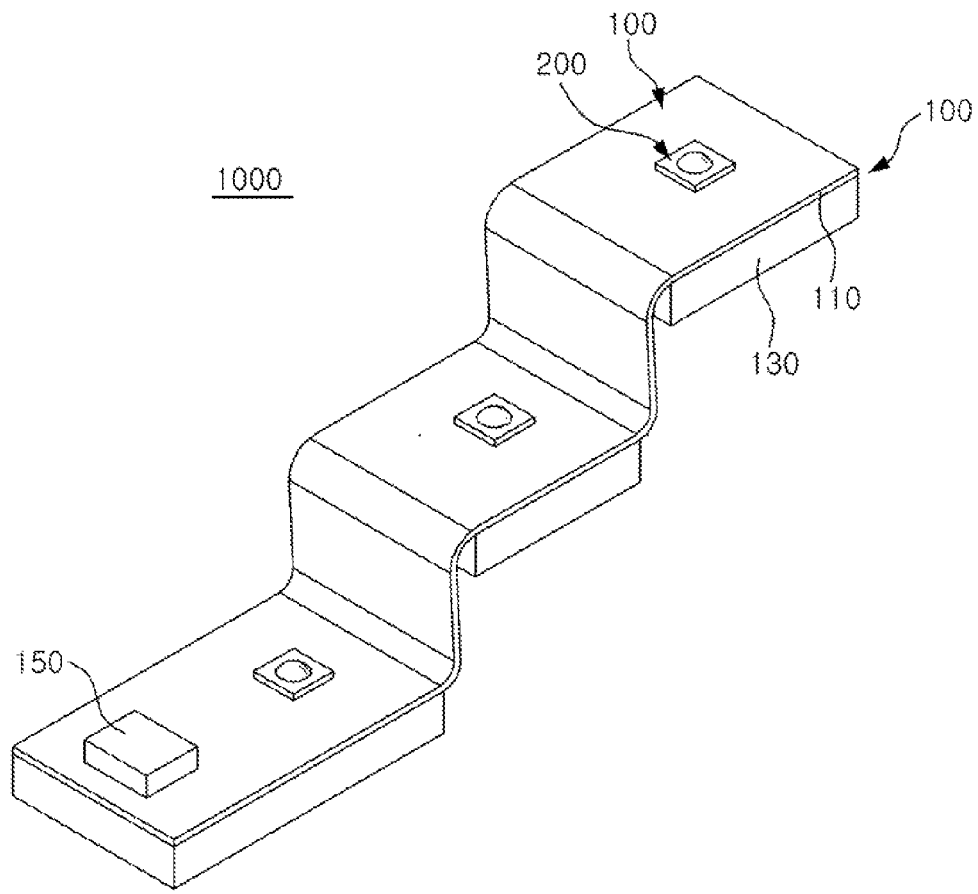
FIG. 4 is a perspective view schematically illustrating a light source module according to an embodiment of the present inventive concept.

FIG. 4 is a perspective view schematically illustrating a light source module according to an embodiment of the present inventive concept.

Referring to FIG. 4, a light source module 1000 may include the substrate unit 100 and a plurality of light source units 200.

The substrate unit 100, the same substrate as described above with reference to FIGS. 1 through 3H, may include the flexible structure 110 and the heat dissipation structure 130. The heat dissipation structure 130 may only be disposed in device regions corresponding to the first regions R1 of FIG. 1 or 3H. The substrate 100 may have a bent form such that the device regions may have different levels, respectively. Also, although not shown, the light source module 1000 may further include a solder resist layer 120 (see FIG. 1) formed on an upper surface of the flexible structure 110. A connector 150 for connection to an external power source may be provided in one end of the substrate unit 100.

The light source unit 200 may be mounted on the substrate unit 100 in each of the device regions in which the heat dissipation structure 130 is disposed. The light source unit 200 may include, for example, a semiconductor light emitting device, and details thereof will be described below with reference to FIGS. 14 through 18. Heat generated by the light source unit 200 during an operation thereof may be dissipated outwardly by the heat dissipation structure 130 of the substrate unit 100. In the present embodiment, three device regions are illustrated, but the present inventive concept is not limited thereto. For example, an amount of the device regions may be variously modified according to a product in which the light source module 1000 is installed.

Since the substrate unit 100 according to the present inventive concept includes a relatively small number of layers and has a relatively smaller thickness, the use of the substrate unit 100 may provide heat dissipation characteristics. Heat dissipation characteristics of the light source module 1000 according to the present embodiment and those of a light source module including a metal core printed circuit board (MCPCB) instead of the substrate unit 100 were measured with the same voltage and under a temperature condition of room temperature by using a thermo-graphic camera and compared. The results showed that the light source module 1000 according to the present embodiment had a 8° C. to 10° C.—lower temperature, confirming that it has high heat dissipation characteristics.

Figure 5:
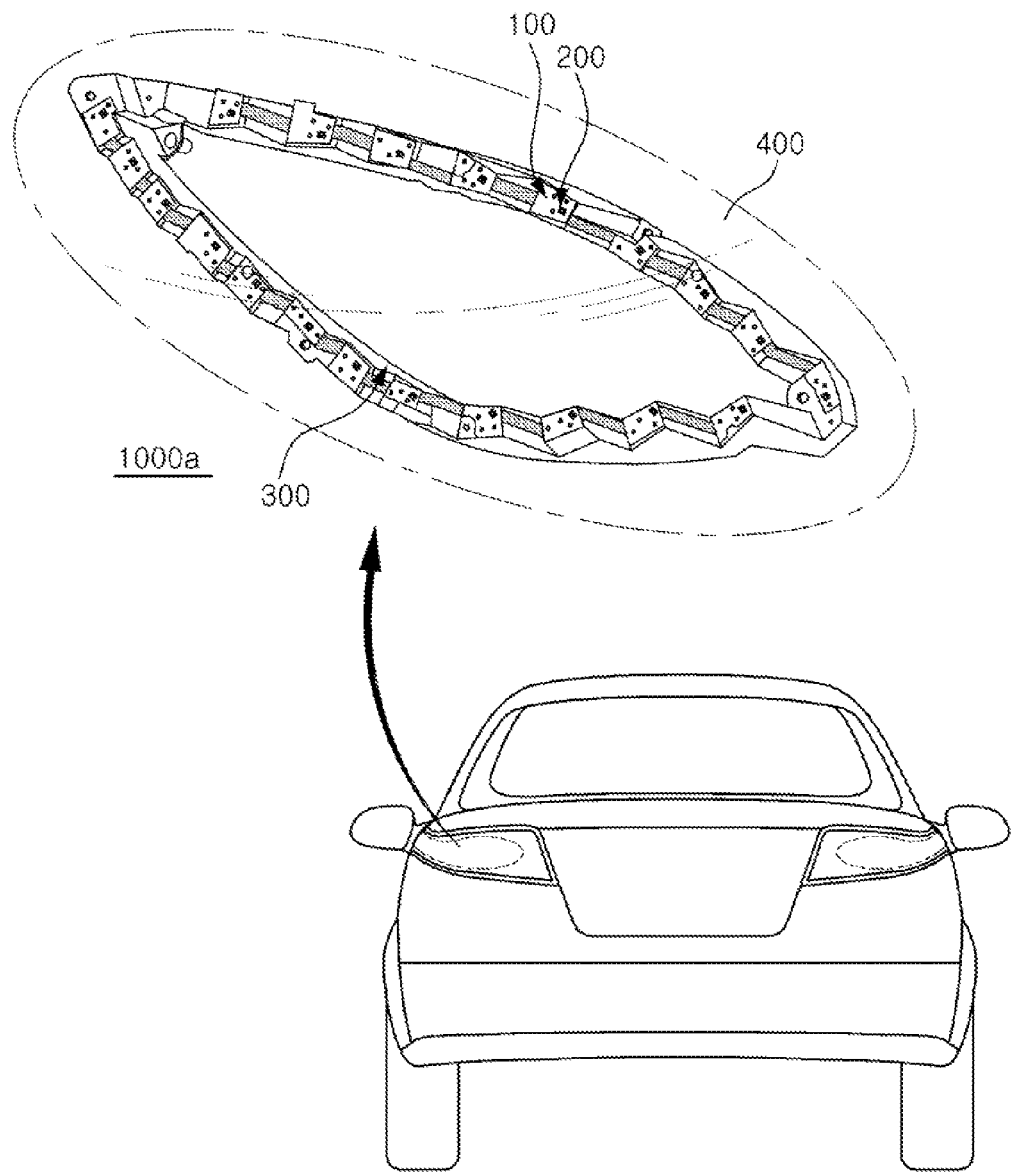
FIG. 5 is a view schematically illustrating a vehicle including a light source module installed therein according to an embodiment of the present inventive concept.

FIG. 5 is a view schematically illustrating a vehicle including a light source module installed therein according to an embodiment of the present inventive concept.

A light source module 1000a may include the substrate unit 100, a plurality of light source units 200, a frame unit 300, and a cover unit 400.

The substrate unit 100, the same substrate as described above with reference to FIGS. 1 through 3H, may have a structure the same as or similar to the foregoing light source module as described above with reference to FIG. 4. A plurality of light source units 200 may be mounted in the device regions of the substrate unit 100. The substrate unit 100 may be bent to allow the device regions to have different levels, respectively, and may have a closed loop shape together with the frame unit 300 having a closed loop shape. Alternatively, the substrate unit 100, having a configuration in which portions thereof are disconnected, may be connected to the frame unit 300 to form a light source module 1000a. Optionally, heat dissipation holes may be formed on an upper surface of the substrate unit 100.

The light source unit 200 may include, for example, a semiconductor light emitting device, and details thereof will be described with reference to FIGS. 14 through 18.

The frame unit 300 may be disposed to cover the side of the substrate unit 100, and may be formed by injection molding an insulating resin, or the like. As illustrated, the frame unit 300 may be installed in a lighting device such as a head lamp, a tail light, or a brake light of a vehicle. Although not shown in detail, the frame unit 300 may include a fastening hole, and the substrate unit 100 may have a protrusion member formed on the side thereof. By inserting the protrusion member of the substrate unit 100 into the fastening hole, the substrate unit 100 may be combined to the frame unit 300.

The cover unit 400 may correspond to an appearance of a vehicle and may have a round shape. Thus, the substrate unit 100 and the frame unit 300 may have a stepwise shape so as to be disposed within the cover unit 400.

Figure 6:
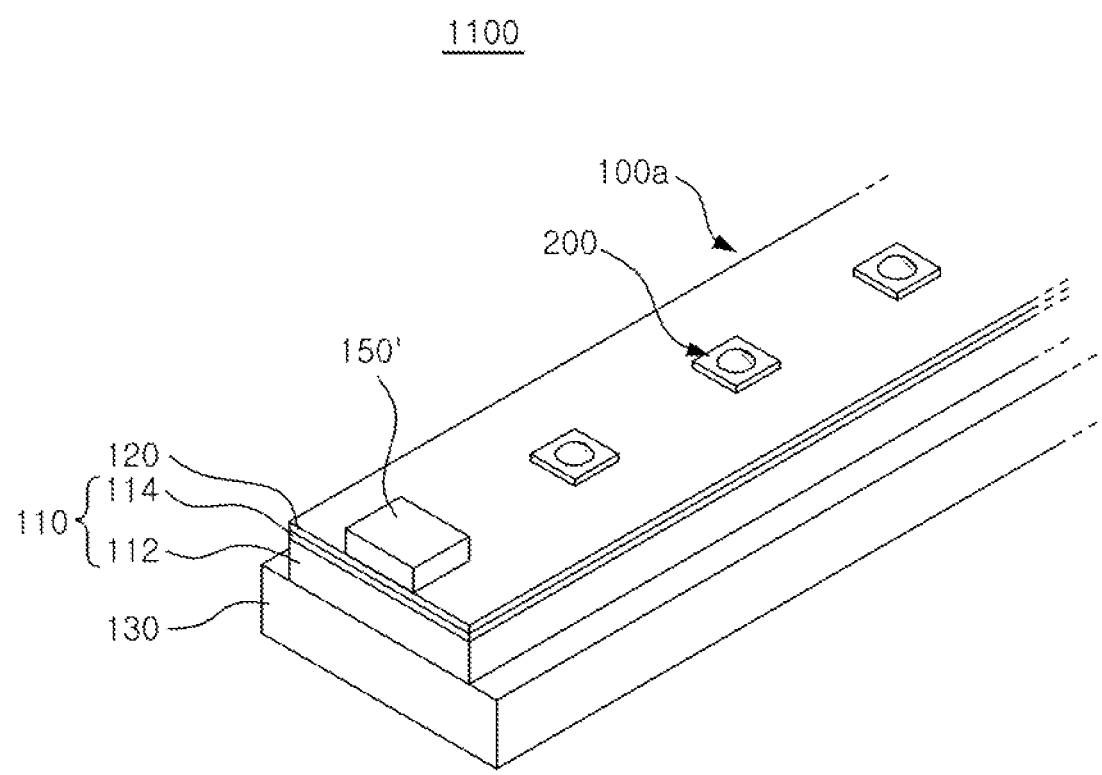
FIG. 6 is a perspective view schematically illustrating a light source module according to an embodiment of the present inventive concept.

FIG. 6 is a perspective view schematically illustrating a light source module according to an embodiment of the present inventive concept.

Referring to FIG. 6, a light source module 1100 may include a substrate unit 100a and a plurality of light source units 200.

The substrate unit 100a, the same substrate as described above with reference to FIGS. 1 through 3H, may include a flexible structure 110 and a heat dissipation structure 130. In the present embodiment, the heat dissipation structure 130 may be a plate-like heat dissipation structure 130 or a bar-like heat dissipation substrate 130 including only the first regions R1 without the second regions R2 of FIG. 1. However, according to an embodiment of the present inventive concept, the heat dissipation structure 130 may only be disposed below the plurality of light source units 200. The substrate 100a may further include a solder resist layer 120 (see FIG. 10) positioned on an upper surface of the flexible structure 110. Also, a connector 150' for connection to an external power source may be provided in one end of the substrate unit 100a.

The light source unit 200 may include, for example, a semiconductor light emitting device. Details thereof will be described below with reference to FIGS. 14 through 18. Heat generated by the light source unit 200 during an operation thereof may be dissipated outwardly by the heat dissipation structure 130 of the substrate unit 100.

Since the substrate unit 100 according to the present inventive concept includes a relatively small number of layers and has relatively small thickness, the use of the substrate unit 100 may secure heat dissipation characteristics.

Figure 7:
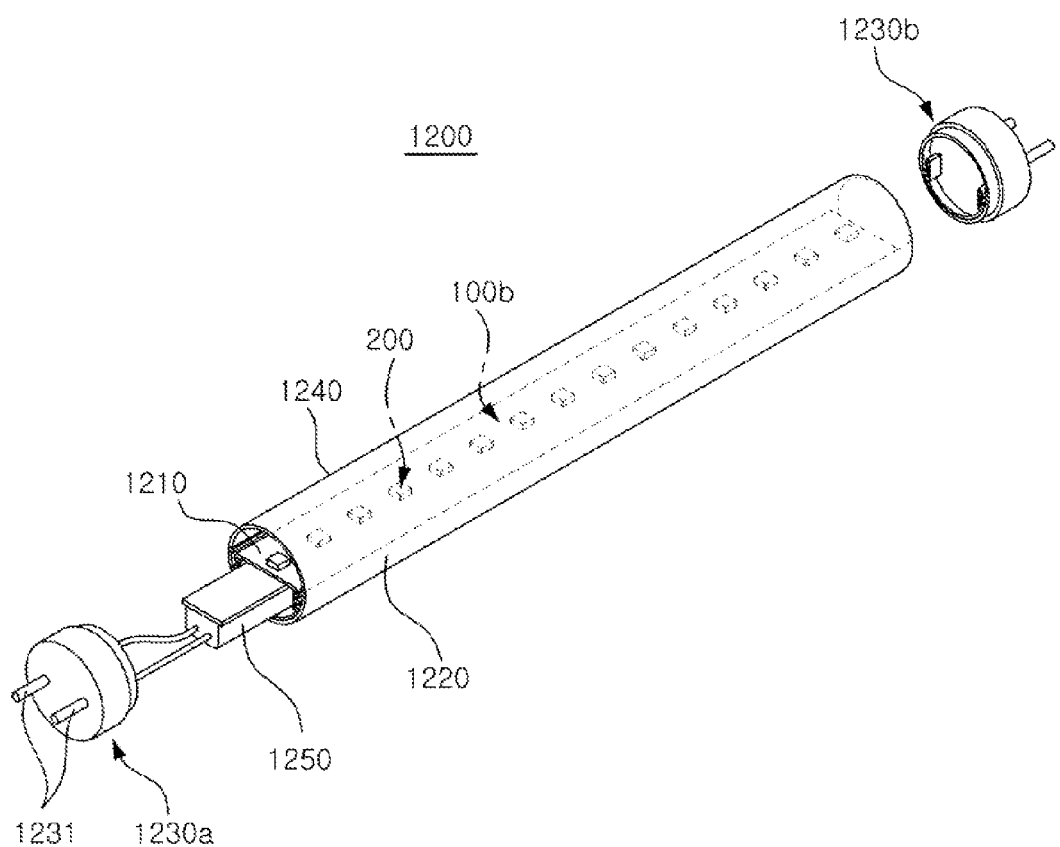
FIGS. 7 and 8 are views schematically illustrating a tubular lighting device including a light source module installed therein according to an embodiment of the present inventive concept.
Figure 8:
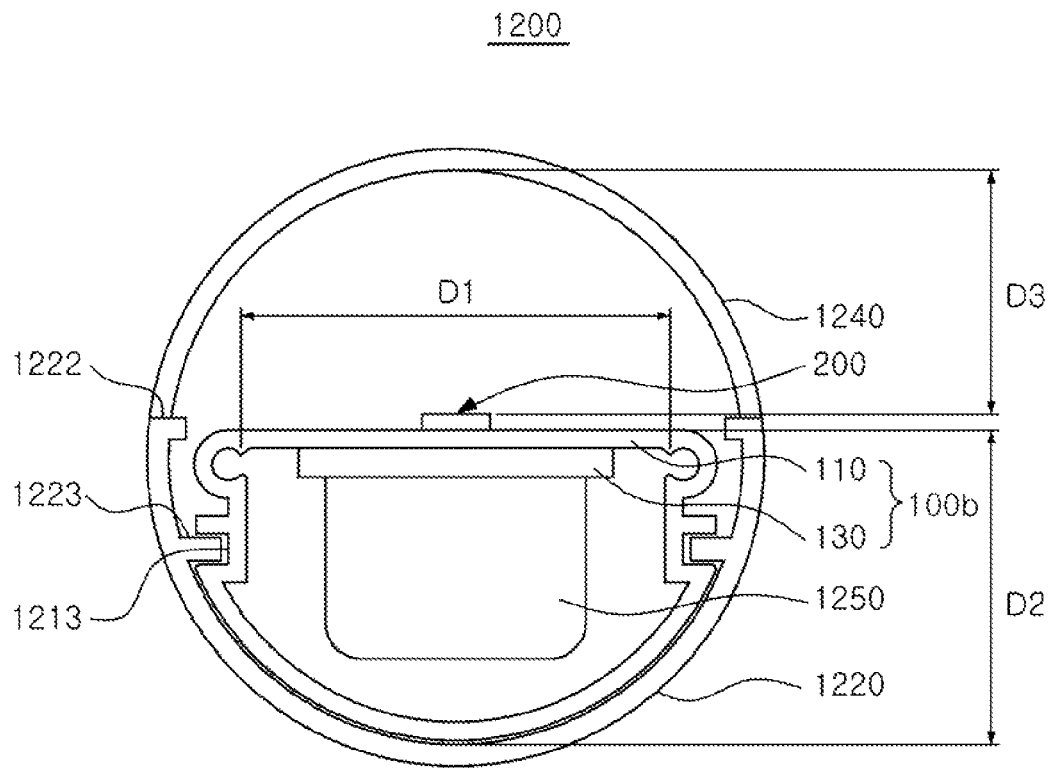

FIGS. 7 and 8 are views schematically illustrating a tubular lighting device including a light source module installed therein according to an embodiment of the present inventive concept. FIG. 7 is a perspective view schematically illustrating a lighting device according to an embodiment of the present inventive concept, and FIG. 8 is a cross-sectional view of the lighting device of FIG. 7.

Referring to FIGS. 7 and 8, a tubular lighting device 1200 may include a light source module 1210, a body unit 1220, and terminal units 1230a and 1230b, and may further include a cover unit 1240 and a power source unit 1250.

The light source module 1210 may include a substrate unit 100b and a plurality of light source units 200 mounted on the substrate unit 100b. The substrate unit 100b is the substrate as described above with reference to FIGS. 1 through 3H, and 6. As illustrated in FIG. 8, the light source module 1210 may include the flexible structure 110 and the heat dissipation structure 130. In the present embodiment, the flexible structure 110 may have a tube-like shape including a flat upper surface, a curved lateral surface, and a lower surface. The heat dissipation structure 130 may only be positioned beneath the upper surface of the flexible structure 110, and may dissipate heat generated by the plurality of light source units 200 outwardly. According to an embodiment, the heat dissipation structure 130 may extend to the lateral surface and lower surface of the flexible structure 110 downwardly, having a shape similar to that of the flexible structure 110. In another embodiment, in the light source module 1210, the substrate unit 100b may be positioned in only an upper region in which the plurality of light source units 200 are mounted, and a support structure may be disposed below the substrate unit 100b.

The light source module 1210 may have stoppage grooves 1213 formed on both lateral surfaces thereof and fastened to the body unit 1220. Referring to FIG. 8, an upper surface of the light source module 1210 may have a first length D1, and the first length D1 may range from 15 mm to 25 mm, for example.

The body unit 1220 may allow the light source module 1210 to be fixed thereto. The body unit 1220, a type of support structure, may have an elongated bar-like shape corresponding to the shape of the substrate unit 100b on the whole. Although not shown, a plurality of heat dissipation fins for heat dissipation may be protruded from both outer surfaces of the body unit 1220. Also, a first groove 1222 and the second groove 1223 may be formed in both ends of the body unit 1220 and extend in a length direction thereof. The cover unit 1240 may be fastened to the first groove 1222, and the substrate unit 100b may be fastened to the second groove 1223.

A distance D2 from a lower portion of the body unit 1220 to a lower surface of the light source unit 200 may range from about 10 mm to 18 mm. The power source unit 1250 may be disposed within the body unit 1220. The power source unit 1250 may include a commercialized power supply unit (PSU), for example.

The terminal units 1230a and 1230b may be provided in both end portions of the body unit 1220 to supply external power to the light source module 1210. In the present embodiment, it is illustrated that both end portions of the body unit 1220 are open and the terminal units 1230a and 1230b are provided in both end portions of the body unit 1220. However, the present inventive concept is not limited thereto and, when the body unit 1220 has a structure in which only one side thereof is open, the terminal units 1230a and 1230b may be provided in only the open end portion among both end portions of the body unit 1220. The terminal units 1230a and 1230b may include electrode pins 1231 protruded outwardly. When the tubular lighting device 1200 is installed in a lighting system (not shown), the terminal units 1230a and 1230b may be physically fastened and electrically connected to a socket through the electrode pins 1231.

The cover unit 1240 is fastened to the body unit 1220 to cover the light source module 1210. The cover unit 1240 may be made of a material allowing light to be transmitted therethrough. The cover unit 1240 may have a curved semicircular surface to allow light to be uniformly irradiated outwardly on the whole. In the present embodiment, the cover unit 1240 is illustrated to have a semicircular shape, but the present inventive concept is not limited thereto. For example, the cover unit 1240 may have a quadrangular shape or any other polygonal shape. The shape of the cover unit 1240 may be variously modified according to an illumination design for irradiating light. According to an embodiment, heat dissipation fins may be formed in the cover unit 1240.

A distance D3 from an upper surface of the light source unit 200 to an upper portion of the cover unit 1240 may range from about 8 mm to 14 mm.

Figure 9:
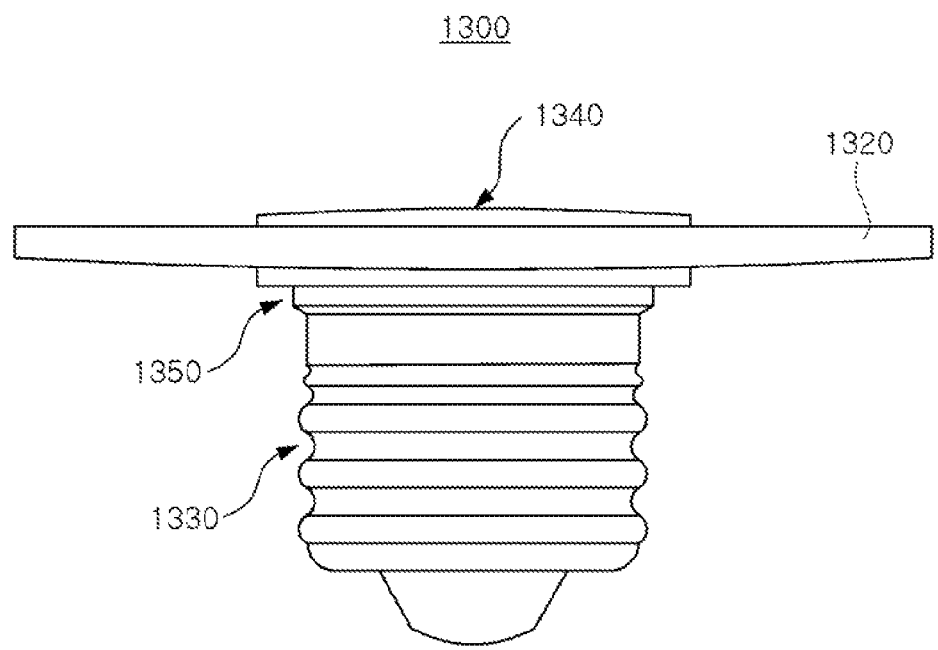
FIGS. 9 and 10 are views schematically illustrating a lighting device including a light source module installed therein according to an embodiment of the present inventive concept.
Figure 10:
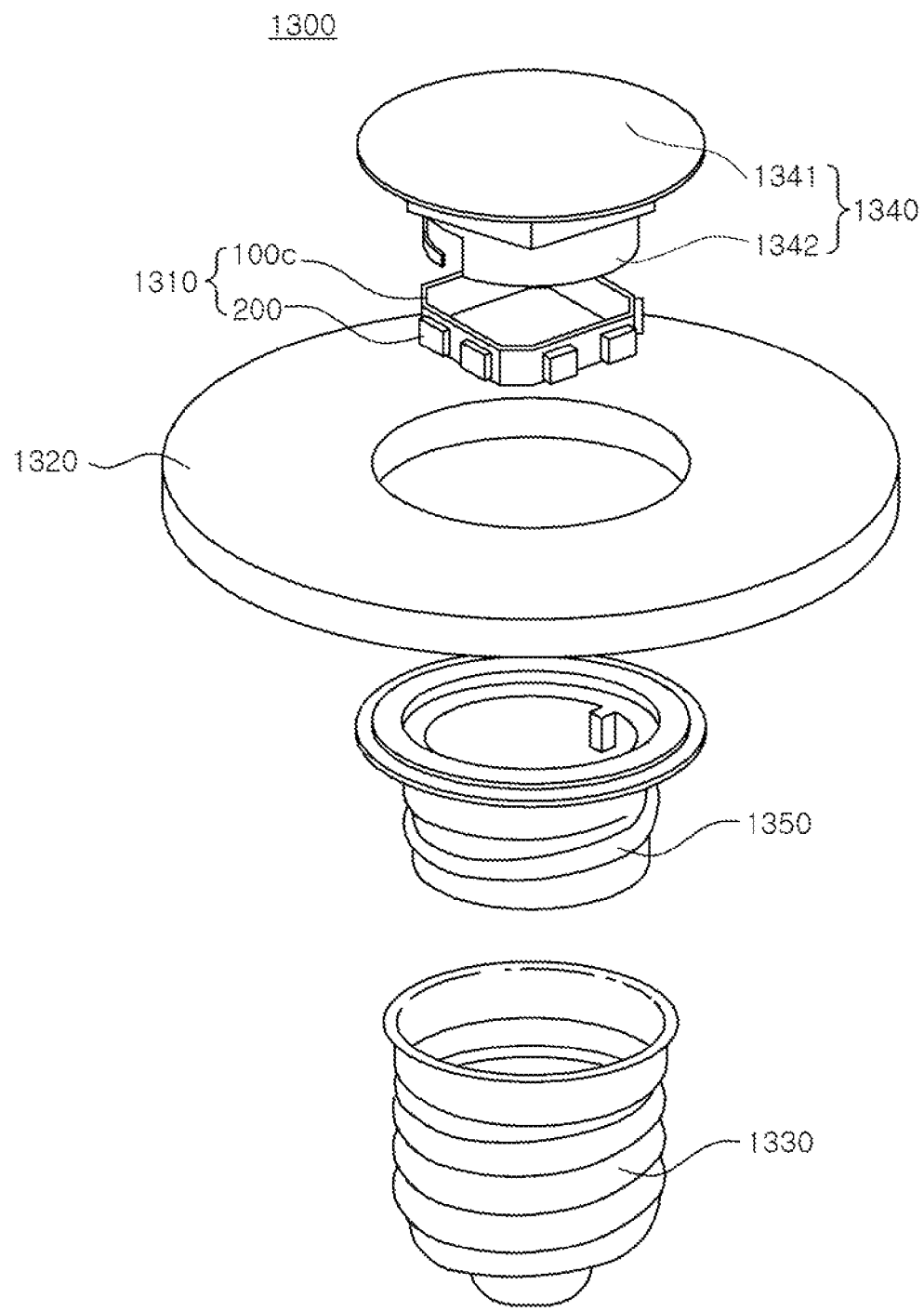

FIGS. 9 and 10 are views illustrating a lighting device including a light source module installed therein according to an embodiment of the present inventive concept. Specifically, FIG. 9 is a side view schematically illustrating a lighting device according to an embodiment of the present inventive concept, and FIG. 10 is an exploded perspective view schematically illustrating the lighting device of FIG. 9.

Referring to FIGS. 9 and 10, a lighting device 1300 according to an embodiment of the present inventive concept may include a light source module 1310, a light spreading unit 1320, and a base unit 1330. The lighting device 1300 may further include a heat dissipating unit 1340 and a housing unit 1350.

The light source module 1310 may irradiate light radially. To this end, the light source module 1310 may include an annular substrate unit 100c and a plurality of light source units 200 mounted on the substrate unit 100c. Although not specifically shown, the substrate unit 100c, the same as that described above with reference to FIGS. 1 through 3H, and 6, may include the flexible structure 110 and the heat dissipation structure 130. In particular, four corner regions illustrated in FIG. 10 may include only the flexible structure 110, and accordingly, the substrate unit 100c may be deformed or bent appropriately according to the light spreading unit 1320 having a curved or an angular shape.

The light spreading unit 1320 guides light irradiated from the light source module 1320 radially to allow light to be emitted outwardly. Namely, the light spreading module 1320 corresponds to a type of light guide member and serves to allow outwardly emitted light to be irradiated laterally and even backwardly, as well as forwardly, thus expanding light distribution regions.

The light spreading unit 1320 may be made of a plastic material having transparency. For example, the material may include polycarbonate (PC), polymethylmethacrylate (PMMA), and the like. Also, the light spreading unit 1320 may be made of a glass material but the present inventive concept is not limited thereto. In order to allow internally incident light to be guided and spread in a manner similar to that of a light guide member, the light spreading unit 1320 may have a solid structure. The light spreading unit 1320 have an accommodation hole formed in the center thereof, having a thin donut-like overall structure. The light source module 1310 may be accommodated and disposed within the accommodation hole.

The base unit 1330 is provided on the lower surface of the light spreading unit 1320 to supply power to the light source module 1310. The base unit 1330 is a type of terminal and may be detachably fastened to a socket provided in a fixed implement in a ceiling, a wall, or the like, and electrically connected thereto. The base unit 1330 may be made of a material having electrical conductivity, for example, a metal. In the present embodiment, the base unit 1330 is illustrated as having an Edison type structure having a screw-fastening type thread, but the present inventive concept is not limited thereto. For example, the base unit 1330 may have a rail type structure or a slide contact type structure. Also, the base unit 1330 may have a USB socket type structure or an adapter socket type structure.

The heat dissipating unit 1340 supports the light source module 1310 such that the light source module 1310 is positioned within the accommodation hole of the light spreading unit 1320, and dissipates heat generated by the light source module 310. The heat dissipation unit 1340 may include a cover 1341 covering the accommodation hole opening upwardly from the upper surface of the light spreading unit 1320 and a body 1342 extending from a lower surface of the cover 1341 and inserted into the accommodation hole. The light source module 1310 may be fixedly attached to an outer surface of the body 1342, and heat generated by the light source module 1310 may be transmitted to the cover 1342 through the body 1342 and discharged outwardly.

The housing unit 1350 may be provided on a lower surface of the light spreading unit 1320 to cover the accommodation hole opening from the lower surface of the light spreading unit 1320. The heat dissipation unit 1340 may be fastened to one surface of the housing unit 1350, and the base unit 1330 may be fastened to the other surface of the housing unit 1350.

The housing unit 1350 may have a hollow structure and may be fabricated through a method such as injection molding, or the like, by using, for example, a resin material. A fastening unit may be formed on an inner surface of the housing 1350 to allow the heat dissipation unit 1340 to be fastened to the housing unit 1350. A fastening unit may also be formed on an outer surface of the housing unit 1350 to allow the base unit 1330 to be detachably fastened thereto.

Figure 11:
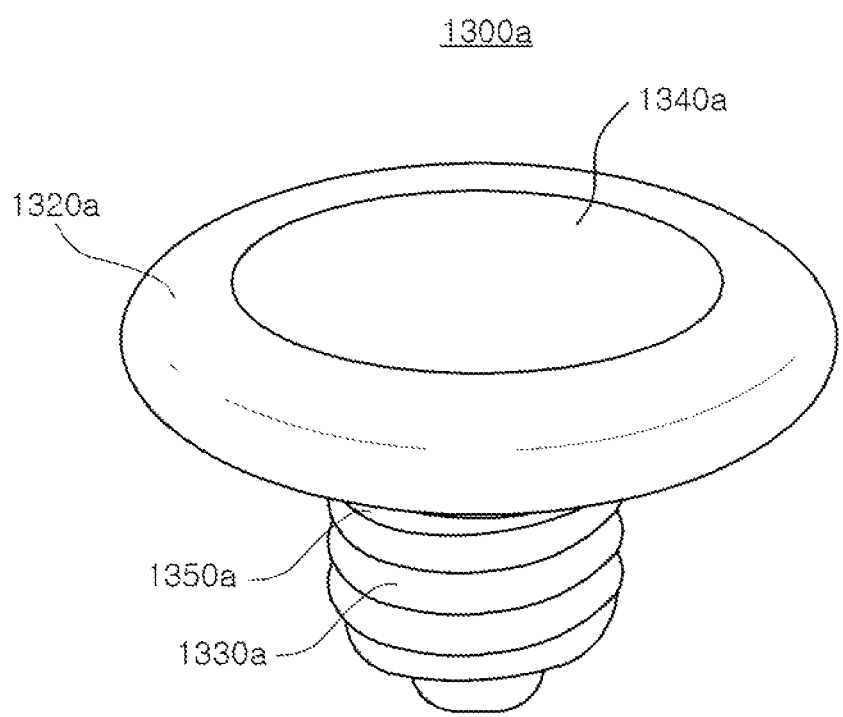
FIGS. 11 and 12 are views schematically illustrating a lighting device including a light source module installed therein according to an embodiment of the present inventive concept.
Figure 12:
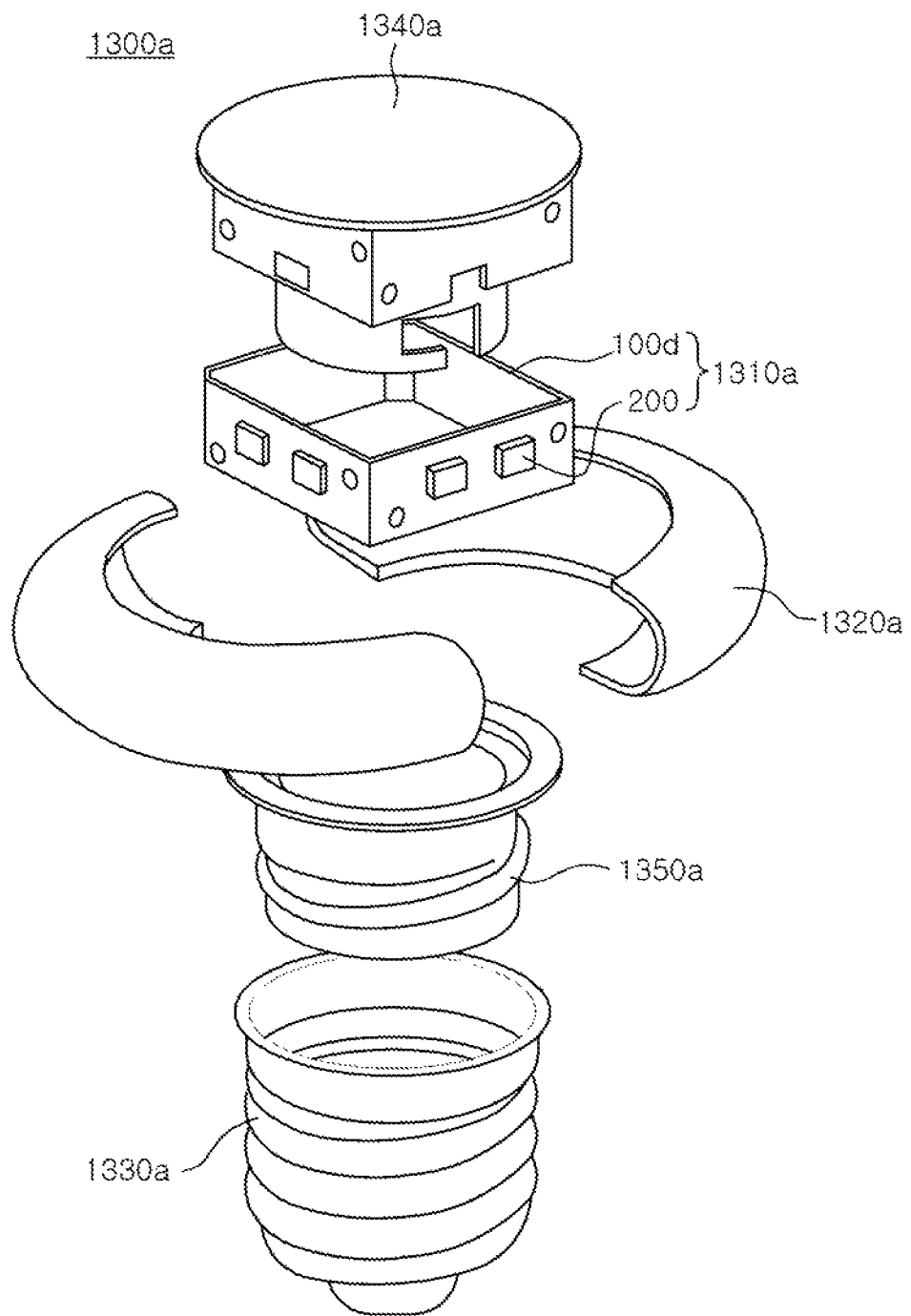

FIGS. 11 and 12 are views illustrating a lighting device including a light source module installed therein according to an embodiment of the present inventive concept. Specifically, FIG. 11 is a perspective view schematically illustrating a lighting device according to an embodiment of the present inventive concept, and FIG. 12 is an exploded perspective view schematically illustrating the lighting device of FIG. 11.

Referring to FIGS. 11 and 12, a lighting device 1300a according to an embodiment of the present inventive concept may include a light source module 1310a, a light spreading unit 1320a, and a base unit 1330a. The lighting device 1300a according to an embodiment of the present inventive concept may further include a heat dissipation unit 1340a and a housing unit 1350a. A configuration of the lighting device 1300a basically has the substantially same structure as that of the embodiment illustrated in FIGS. 9 and 10, except for a structure of the light spreading unit 1320a. Thus, hereinafter, descriptions of configurations the same as those of the former embodiment will be omitted, and the structure of the light spreading unit 1320a will be described.

The light spreading unit 1320a may have a hollow structure. Namely, unlike the former embodiment in which the light spreading unit has a solid structure as illustrated in FIGS. 9 and 10, the light spreading unit 1320a according to the present embodiment may have a hollow structure to form an internal space for accommodating the light source module 1310 therein.

The light spreading unit 1320a may have a slim tire-like shape on the whole. Also, the light spreading unit 1320a may be divided into a plurality of sectional members. Also, the light spreading unit 1320a may be formed by coupling the sectional members. However, according to an embodiment, the light spreading unit 1320a may be a singular structure.

The light source module 1310a may include an annular substrate unit 100d and a plurality of light source units 200 mounted on the substrate unit 100d. In the present embodiment, portions of the light source module 1310a and the heat dissipation unit 1340a may be deformed according to a shape of the light spreading unit 1320a.

Figure 13:
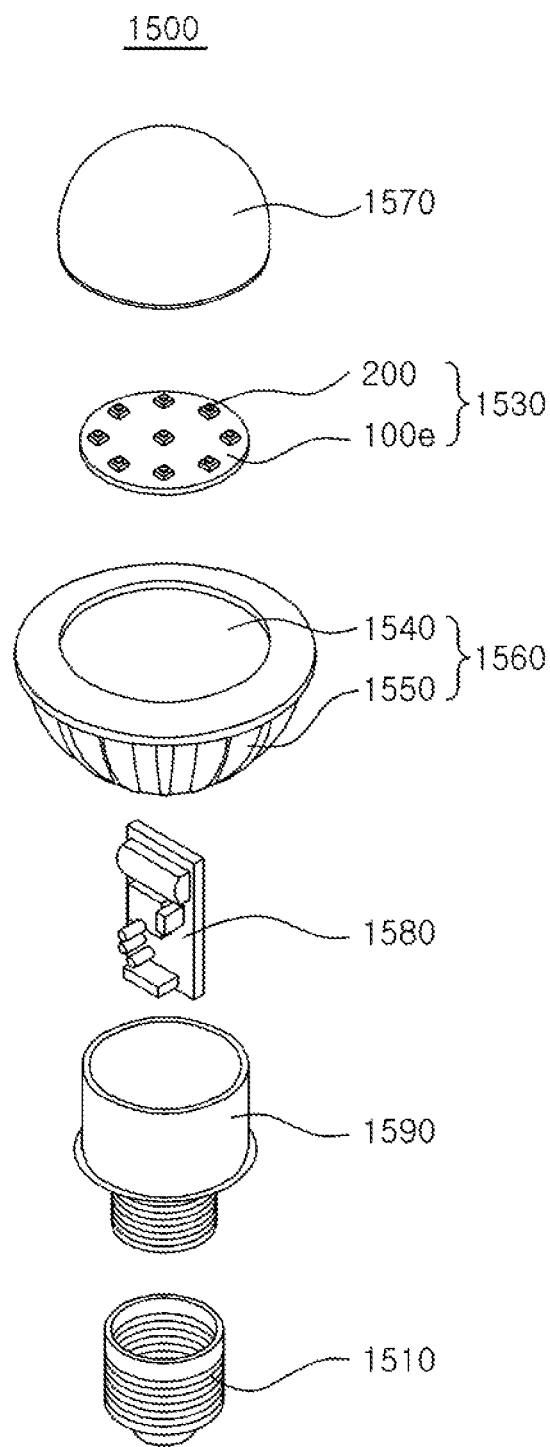
FIG. 13 is a view illustrating an example of application of a light source module to a lighting device according to an embodiment of the present inventive concept.

FIG. 13 is a view illustrating an example of application of a light source module to a lighting device according to an embodiment of the present inventive concept.

Referring to the exploded perspective view of FIG. 13, a lighting device 1500 is illustrated, for example, as a bulb lamp, and includes a light source module 1530, a driving unit 1580, and an external connection unit 1510. Also, the lighting device 1500 may include external structures such as external and internal housings 1560 and 1590 and a cover unit 1570.

The light source module 1530 may include a substrate unit 100e and a plurality of light source units 200 mounted on the substrate 100e. The substrate unit 100e is the same as or similar to that described above with reference to FIGS. 1 through 3H, and 6. Although not shown, the substrate unit 100e may include the flexible structure 110 and the heat dissipation structure 130.

The external housing 1560 may serve as a heat dissipation unit, and may include a heat dissipation plate 1540 in direct contact with the light source module 1530 to enhance heat dissipation effect and heat dissipation fins 1550 surrounding the sides of the lighting device 1500. The cover unit 1570 is installed on the light source module 1530 and may have a convex lens shape. The driving unit 1580 may be installed in the internal housing 1590 and connected to the external connection unit 1510 to be provided with power from an external power source. Also, the driving unit 1580 may serve to convert received power into an appropriate current source for driving the light source unit 200 of the light emitting module 1530 and provide the same. For example, the driving unit 1580 may be configured as an AC-DC converter, a rectifier circuit component, or the like.

Also, although not shown, the lighting device may further include a communications module.

Hereinafter, various light emitting devices employable in the present embodiment will be described.

<Light Emitting Device-First Example>

Figure 14:
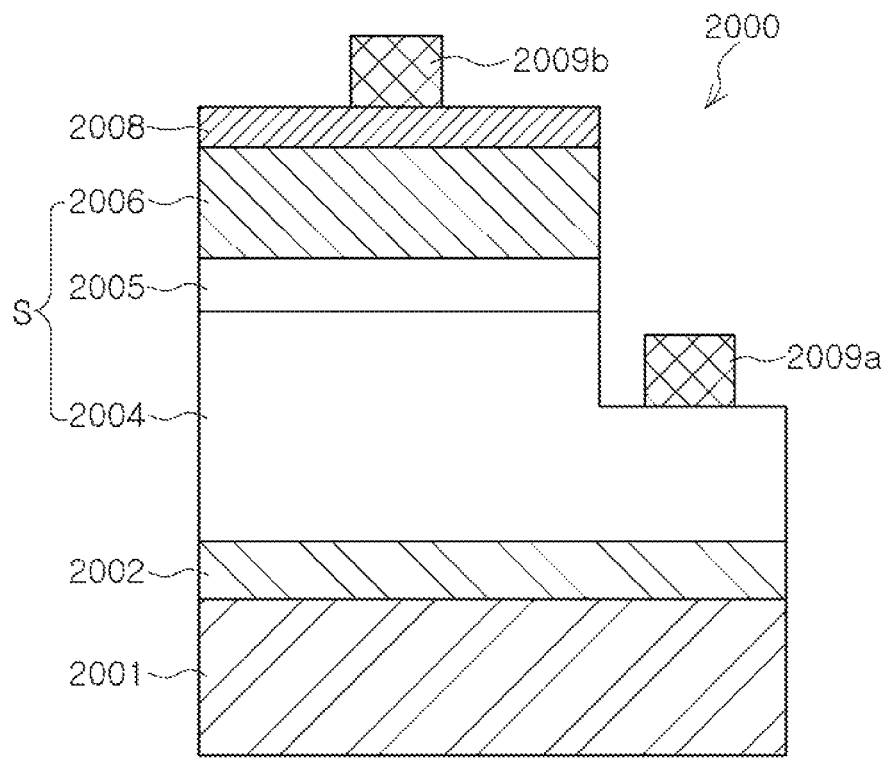
FIGS. 14 through 16 are cross-sectional views schematically illustrating examples of a light emitting device (or an LED chip) employable in a light source module according to an embodiment of the present inventive concept.

FIG. 14 is a side cross-sectional view schematically illustrating an example of a light emitting device (an LED chip).

As illustrated in FIG. 14, a light emitting device 2000 may include a light emitting laminate S formed on a growth substrate 2001. The light emitting laminate S may include a first conductivity-type semiconductor layer 2004, an active layer 2005, and a second conductivity-type semiconductor layer 2006.

An ohmic-contact layer 2008 may be formed on the second conductivity-type semiconductor layer 2006, and first and second electrodes 2009a and 2009b may be formed on upper surfaces of the first conductivity-type semiconductor layer 2004 and the ohmic-contact layer 2008, respectively.

In the present disclosure, terms such as 'upper portion', 'upper surface', 'lower portion', 'lower surface', 'lateral surface', and the like, are determined based on the drawings, and the relative orientations imparted by these terms may be changed according to a direction in which a light emitting device is disposed.

Hereinafter, major components of the light emitting device will be described.

[Substrate]

As the substrate 2001, an insulating substrate, a conductive substrate, or a semiconductor substrate may be used as necessary. For example, sapphire, SiC, Si, $MgAl_2O_4$, MgO, $LiAlO_2$, $LiGaO_2$, or GaN may be used as a material of the substrate 2001. For epitaxial growth of a GaN material, a GaN substrate, a homogeneous substrate, may be desirable, but it may incur high production costs due to difficulties in manufacturing thereof.

As a heterogeneous substrate, a sapphire substrate, a silicon carbide substrate, or the like, is largely used, and in this case, a sapphire substrate is utilized relatively more than the costly silicon carbide substrate. When a heterogeneous substrate is used, defects such as dislocation, and the like, are increased due to differences in lattice constants between a substrate material and a thin film material. Also, differences in coefficients of thermal expansion between the substrate material and the thin film material may cause bowing due to changing temperatures, and the bowing may cause cracks in the thin film. This problem may be reduced by using a buffer layer 2002 between the substrate 2001 and the light emitting laminate S based on GaN.

The substrate 2001 may be fully or partially removed or patterned during a chip manufacturing process in order to enhance optical or electrical characteristics of the LED chip before or after the light emitting laminate S is grown. For example, a sapphire substrate may be separated by irradiating a laser on the interface between the substrate and a semiconductor layer through the substrate, and a silicon substrate or a silicon carbide substrate may be removed through a method such as polishing, etching, or the like. In removing the substrate, a support substrate may be used, and in this case, in order to enhance luminance efficiency of an LED chip on the opposite side of the original growth substrate, the support substrate may be bonded by using a reflective metal or a reflective structure may be inserted into the center of a junction layer.

Substrate patterning forms a concavo-convex surface or a sloped surface on a main surface (one surface or both surfaces) or lateral surfaces of a substrate before or after the growth of the light emitting laminate S, enhancing light extraction efficiency. A pattern size may be selected within the range from 5 nm to 500 µm. The substrate may have any structure as long as it has a regular or irregular pattern to enhance light extraction efficiency. The substrate may have various shapes such as a columnar shape, a peaked shape, a hemispherical shape, a polygonal shape, and the like.

Here, the sapphire substrate is a crystal having Hexa-Rhombo R3c symmetry, of which lattice constants in c-axial and a-axial directions are approximately 13.001 Å and 4.758 Å, respectively, and has a C-plane (0001), an A-plane (1120), an R-plane (1102), and the like. In this case, the C-plane of sapphire crystal allows a nitride thin film to be relatively easily grown thereon and is stable at high temperatures, so the sapphire substrate is commonly used as a nitride growth substrate.

The substrate 2001 may also be made of silicon (Si). Since a silicon (Si) substrate is more appropriate for increasing a diameter and is relatively low in price, it may be used to facilitate mass-production. Here, a difference in lattice constants between the silicon substrate having a (111) plane as a substrate surface and GaN is approximately 17%, requiring a technique of suppressing the generation of crystal defects due to the difference between the lattice constants is required. Also, a difference in coefficients of thermal expansion between silicon and GaN is approximately 56%, requiring a technique of suppressing the bowing of a wafer generated due to the difference in the coefficients of thermal expansion. Bowed wafers may result in cracks in the GaN thin film and make it difficult to control processes to increase dispersion of emission wavelengths (or excitation wavelengths) of light in the same wafer, or the like.

The silicon substrate absorbs light generated in the GaN-based semiconductor, lowering external quantum yield of the light emitting device. Thus, the substrate may be removed and a support substrate such as a silicon substrate, a germanium substrate, an SiAl substrate, a ceramic substrate, a metal substrate, or the like, including a reflective layer may be additionally formed to be used, as necessary.

[Buffer Layer]

When a GaN thin film is grown on a heterogeneous substrate such as the silicon substrate, dislocation density may be increased due to a lattice constant mismatch between a substrate material and a thin film material, and cracks and warpage (or bowing) may be generated due to a difference between coefficients of thermal expansion. In order to prevent dislocation of and cracks in the light emitting laminate S, the buffer layer 2002 may be disposed between the substrate 2001 and the light emitting laminate S. The buffer layer 2002 may serve to adjust a degree of warpage of the substrate 2001 when an active layer is grown, to reduce a wavelength dispersion of a wafer.

The buffer layer 2002 may be made of AlxInyGa1−x−yN (0≤x≤1, 0≤y≤1), in particular, GaN, AlN, AlGaN, InGaN, or InGaNAlN, and a material such as $ZrB_2$, $HfB_2$, ZrN, HfN, TiN, or the like, may also be used as necessary. Also, the buffer layer 2002 may be formed by combining a plurality of layers or by gradually changing a composition.

A silicon (Si) substrate has a coefficient of thermal expansion significantly different from that of GaN. Thus, in the case of growing a GaN-based thin film on the silicon substrate, when a GaN thin film is grown at a high temperature and is subsequently cooled to room temperature, tensile stress is applied to the GaN thin film due to the difference in the coefficients of thermal expansion between the silicon substrate and the GaN thin film, generating cracks. In this case, in order to prevent the generation of cracks, a method of growing the GaN thin film such that compressive stress is applied to the GaN thin film while the GaN thin film is being grown is used to compensate for tensile stress.

A difference in the lattice constants between silicon (Si) and GaN involves a high likelihood of a defect being generated therein. In the case of a silicon substrate, a buffer layer having a composite structure may be used in order to control stress for restraining warpage (or bowing) as well as controlling a defect.

For example, first, an AlN layer is formed on the substrate 2001. In this case, a material not including gallium (Ga) may be used in order to prevent a reaction between silicon (Si) and gallium (Ga). Besides AlN, a material such as SiC, or the like, may also be used. The AlN layer is grown at a temperature ranging from 400° C. to 1,300° C. by using an aluminum (Al) source and a nitrogen (N) source. An AlGaN intermediate layer may be inserted into the center of GaN between the plurality of AlN layers to control stress, as necessary.

[Light Emitting Laminate]

The light emitting laminate S having a multilayer structure of a Group III nitride semiconductor will be described in detail. The first and second conductivity-type semiconductor layers 2004 and 2006 may be formed of n-type and p-type impurity-doped semiconductor materials, respectively. However, the present inventive concept is not limited thereto and, conversely, the first and second conductivity-type semiconductor layers 2004 and 2006 may be formed of p-type and n-type impurity-doped semiconductor materials, respectively. For example, the first and second conductivity-type semiconductor layers 2004 and 2006 may be made of a Group III nitride semiconductor, e.g., a material having a composition of $Al_xIn_yGa_{1-x-y}N$ (0≤x≤1, 0≤y≤1, 0≤x+y≤1). Of course, the present inventive concept is not limited thereto and the first and second conductivity-type semiconductor layers 2004 and 2006 may also be made of a material such as an AlGaInP-based semiconductor or an AlGaAs-based semiconductor.

Meanwhile, the first and second conductivity-type semiconductor layers 2004 and 2006 may have a unilayer structure, or, alternatively, the first and second conductivity-type semiconductor layers 2004 and 2006 may have a multilayer structure including layers having different compositions, thicknesses, and the like, as necessary. For example, the first and second conductivity-type semiconductor layers 2004 and 2006 may have a carrier injection layer for improving electron and hole injection efficiency, or may have various types of superlattice structure, respectively.

The first conductivity-type semiconductor layer 2004 may further include a current spreading layer (not shown) in a region adjacent to the active layer 2005. The current spreading layer may have a structure in which a plurality of $In_xAl_yGa_{(1-x-y)}N$ layers having different compositions or different impurity contents are iteratively laminated or may have an insulating material layer partially formed therein.

The second conductivity-type semiconductor layer 2006 may further include an electron blocking layer in a region adjacent to the active layer 2005. The electron blocking layer may have a structure in which a plurality of $In_xAl_yGa_{(1-x-y)}N$ layers having different compositions are laminated or may have one or more layers including $Al_yGa_{(1-y)}N$. The electron blocking layer has a bandgap wider than that of the active layer 2005, thus preventing electrons from being transferred via the second conductivity-type (p-type) semiconductor layer 2006.

The light emitting laminate S may be formed by using metal-organic chemical vapor deposition (MOCVD). In order to fabricate the light emitting laminate S, an organic metal compound gas (e.g., trimethyl gallium (TMG), trimethyl aluminum (TMA)) and a nitrogen-containing gas (ammonia ($NH_3$), or the like) are supplied to a reaction container in which the substrate 2001 is installed as reactive gases, the substrate being maintained at a high temperature ranging from 900° C. to 1,100° C., and while a gallium nitride-based compound semiconductor is being grown, an impurity gas is supplied as necessary to laminate the gallium nitride-based compound semiconductor as an undoped n-type or p-type semiconductor. Silicon (Si) is a well known n-type impurity and p-type impurity includes zinc (Zn), cadmium (Cd), beryllium (Be), magnesium (Mg), calcium (Ca), barium (Ba), and the like. Among these, magnesium (Mg) and zinc (Zn) may be mainly used.

Also, the active layer 2005 disposed between the first and second conductivity-type semiconductor layers 2004 and 2006 may have a multi-quantum well (MQW) structure in which a quantum well layer and a quantum barrier layer are alternately laminated. For example, in the case of a nitride semiconductor, a GaN/InGaN structure may be used, or a single quantum well (SQW) structure may also be used.

[Ohmic-Contact Layer and First and Second Electrodes]

The ohmic-contact layer 2008 may have a relatively high impurity concentration to have low ohmic-contact resistance to lower an operating voltage of the element and enhance element characteristics. The ohmic-contact layer 2008 may be formed of a GaN layer, a InGaN layer, a ZnO layer, or a graphene layer.

The first or second electrode 2009a or 2009b may be made of a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a structure including two or more layers such as Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like.

The LED chip illustrated in FIG. 14 has a structure in which first and second electrodes 2009a and 2009b face the same surface as a light extraction surface, but it may also be implemented to have various other structures, such as a flip-chip structure in which first and second electrodes face a surface opposite to a light extraction surface, a vertical structure in which first and second electrodes are formed on mutually opposing surfaces, a vertical and horizontal structure employing an electrode structure by forming several vias in a chip as a structure for enhancing current spreading efficiency and heat dissipation efficiency, and the like.

<Light Emitting Device-Second Example>

Figure 15:
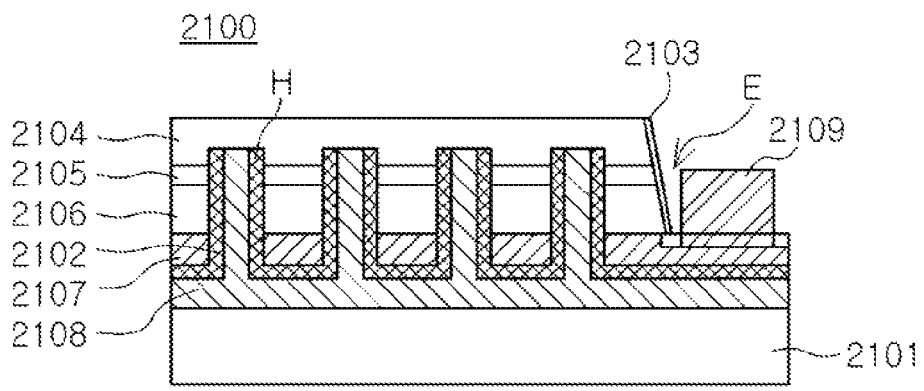

In the case of manufacturing a large light emitting device for a high output, an LED chip illustrated in FIG. 15 having a structure promoting current spreading efficiency and heat dissipation efficiency may be provided.

As illustrated in FIG. 15, the LED chip 2100 may include a first conductivity-type semiconductor layer 2104, an active layer 2105, a second conductivity-type semiconductor layer 2106, a second electrode layer 2107, an insulating layer 2102, a first electrode 2108, and a substrate 2101, laminated sequentially. Here, in order to be electrically connected to the first conductivity-type semiconductor layer 2104, the first electrode layer 2108 includes one or more contact holes H extending from one surface of the first electrode layer 2108 to at least a partial region of the first conductivity-type semiconductor layer 2104 and electrically insulated from the second conductivity-type semiconductor layer 2106 and the active layer 2105. However, the first electrode layer 2108 is not an essential element in the present embodiment.

The contact hole H extends from an interface of the first electrode layer 2108, passing through the second electrode layer 2107, the second conductivity-type semiconductor layer 2106, and the first active layer 2105, to the interior of the first conductivity-type semiconductor layer 2104. The contact hole H extends at least to an interface between the active layer 2105 and the first conductivity-type semiconductor layer 2104, and preferably, but not necessarily, extends to a portion of the first conductivity-type semiconductor layer 2104. However, the contact hole H is formed for electrical connectivity and current spreading, so the purpose of the presence of the contact hole H is achieved when it is in contact with the first conductivity-type semiconductor layer 2104. Thus, it is not necessary for the contact hole H to extend to an external surface of the first conductivity-type semiconductor layer 2104.

The second electrode layer 2107 formed on the second conductivity-type semiconductor layer 2106 may be selectively made of a material among silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and the like, in consideration of a light reflecting function and an ohmic-contact function with the second conductivity-type semiconductor layer 2106, and may be formed by using a process such as sputtering, deposition, or the like.

The contact hole H may have a form penetrating the second electrode layer 2107, the second conductivity-type semiconductor layer 2106, and the active layer 2105 so as to be connected to the first conductivity-type semiconductor layer 2104. The contact hole H may be formed through an etching process, e.g., inductively coupled plasma-reactive ion etching (ICP-RIE), or the like. A depth of the contact hole H may range from 0.5 µm to 5.0 µm, but it may vary according to thicknesses of the second conductivity semiconductor layer 2106 and the active layer 2105.

The insulating layer 2102 is formed to cover a side wall of the contact hole H and a surface of the second electrode layer 2107. In this case, at least a portion of the first conductivity-type semiconductor layer 2104 corresponding to a lower surface of the contact hole H may be exposed. The insulating layer 2102 may be formed by depositing an insulating material such as $SiO_2$, $SiO_xN_y$, or $Si_xN_y$.

The insulating layer 2102 may be deposited to have a thickness ranging from about 0.01 µm to 3 µm at a temperature equal to or lower than 500° C. through a chemical vapor deposition (CVD) process.

The first electrode layer 2108 including a conductive via formed by filling a conductive material is formed within the contact hole H.

A plurality of conductive vias may be formed in a single LED chip 2100 region.

The amount of vias and contact areas thereof may be adjusted such that the area occupied by the plurality of vias on the plane of the regions in which they are in contact with the first conductivity-type semiconductor layer 2104 ranges from 1% to 5% of the area of the LED chip 2100 region. A radius of the via on the plane of the region in which the conductive vias are in contact with the first conductivity-type semiconductor layer 2104 may range, for example, from 5 µm to 50 µm, and the number of conductive vias may be 1 to 50 per LED chip 2100 region according to a width of the LED chip 2100 region. Although different according to a width of the LED chip 2100 region, three or more conductive vias may be provided. A distance between the respective conductive vias may range from 100 μm to 500 μm, and the conductive vias may have a matrix structure including rows and columns. Preferably, but not necessarily, the distance between the vias may range from 150 μm to 450 μm. If the distance between the conductive vias is less than 100 μm, the amount of vias is increased to relatively reduce a light emitting area to lower luminous efficiency, and if the distance between the conductive vias is greater than 500 μm, current spreading may suffer to degrade luminous efficiency.

Subsequently, the substrate 2101 is formed on the first electrode layer 2108. In this structure, the substrate 2101 may be electrically connected by the conductive via connected to the first conductivity-type semiconductor layer 2104.

The substrate 2101 may be made of a material including any one of Au, Ni, Al, Cu, W, Si, Se, GaAs, SiAl, Ge, SiC, AlN, Al$_2$O$_3$, GaN, AlGaN and may be formed through a process such as plating, sputtering, deposition, bonding, or the like.

In order to reduce contact resistance, the amount, a shape, a pitch, a contact area with the first and second conductivity-type semiconductor layers 2104 and 2106, and the like, of the contact hole H may be appropriately regulated. The contact holes H may be arranged to have various shapes in rows and columns to improve a current flow.

<Light Emitting Device-Third Example>

An LED lighting device provides improved heat dissipation characteristics, but in the aspect of overall heat dissipation performance, preferably, but not necessarily, the lighting device employs an LED chip having a low heating value. As an LED chip satisfying such requirements, an LED chip including a nano-structure (hereinafter, referred to as a 'nano-LED chip') may be used.

Such a nano-LED chip includes a recently developed core/shell type nano-LED chip, having a low binding density to generate a relatively low degree of heat, has increased luminous efficiency by increasing a light emitting region by utilizing nano-structures, and prevents a degradation of efficiency due to polarization by obtaining a non-polar active layer, thus improving drop characteristics.

Figure 16:
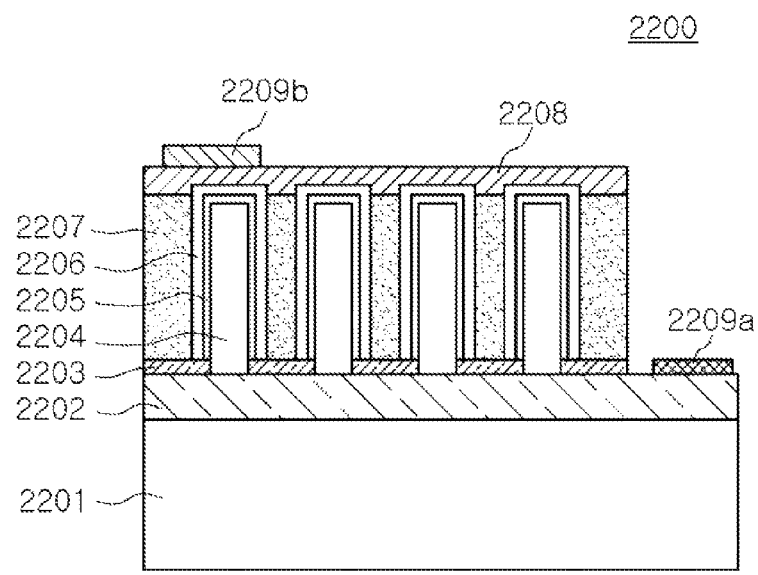

FIG. 16 is a cross-sectional view illustrating a nano-LED chip as another example of an LED chip that may be employed in a light source module.

As illustrated in FIG. 16, a nano-LED chip 2200 includes a plurality of nano-light emitting structures formed on a substrate 2201. In this example, it is illustrated that the nano-light emitting structure has a core-shell structure as a rod structure, but the present inventive concept is not limited thereto and the nano-light emitting structures may have a different structure such as a pyramid structure.

The nano-LED chip 2200 includes a base layer 2202 formed on the substrate 2201. The base layer 2202 is a layer providing a growth surface for the nano-light emitting structures, which may be a first conductivity-type semiconductor layer. A mask layer 2203 having an open area for the growth of the nano-light emitting structure N (in particular, the core) may be formed on the base layer 2202. The mask layer 2203 may be made of a dielectric material such as SiO$_2$ or SiNx.

In the nano-light emitting structures, a first conductivity-type nano-core 2204 is formed by selectively growing a first conductivity-type semiconductor by using the mask layer 2203 having an open area, and an active layer 2205 and a second conductivity-type semiconductor layer 2206 are formed as shell layers on a surface of the nano core 2204. Accordingly, the nano-light emitting structures may have a core-shell structure in which the first conductivity-type semiconductor is the nano core and the active layer 2205 and the second conductivity-type semiconductor layer 2206 enclosing the nano core are shell layers.

The nano-LED chip 2200 according to the present example includes a filler material 2207 filling spaces between the nano-light emitting structures. The filler material 2207 may structurally stabilize the nano-light emitting structures and may be employed as necessary in order to optically improve the nano-light emitting structures N. The filler material 2207 may be made of a transparent material such as SiO$_2$, or the like, but the present inventive concept is not limited thereto. An ohmic-contact layer 2208 may be formed on the nano-light emitting structures and connected to the second conductivity-type semiconductor layer 2206. The nano-LED chip 2200 includes first and second electrodes 2209$a$ and 2209$b$ connected to the base layer 2202 formed of the first conductivity-type semiconductor and the ohmic-contact layer 2208, respectively.

By forming the nano-light emitting structures such that they have different diameters, components, and doping densities, light having two or more different wavelengths may be emitted from the single device. By appropriately adjusting light having different wavelengths, white light may be implemented without using phosphors in the single device, and light having various desired colors or white light having different color temperatures may be implemented by combining a different LED chip with the foregoing device or combining wavelength conversion materials such as phosphors.

<Light Emitting Device-Fourth Example>

Figure 17:
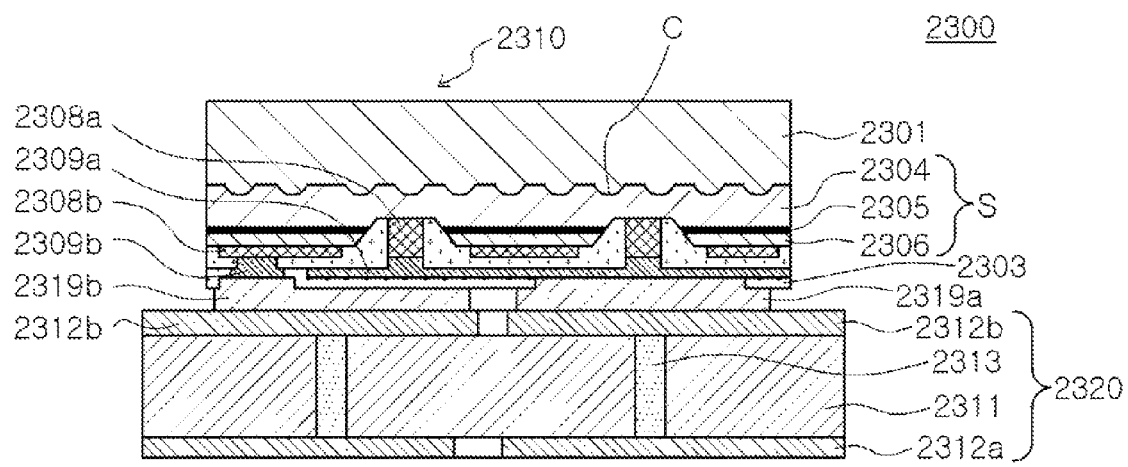
FIG. 17 is a cross-sectional view illustrating an example of an LED chip as a light emitting device employable in a light source module according to an embodiment of the present inventive concept, mounted on a mounting board.
Figure 18:
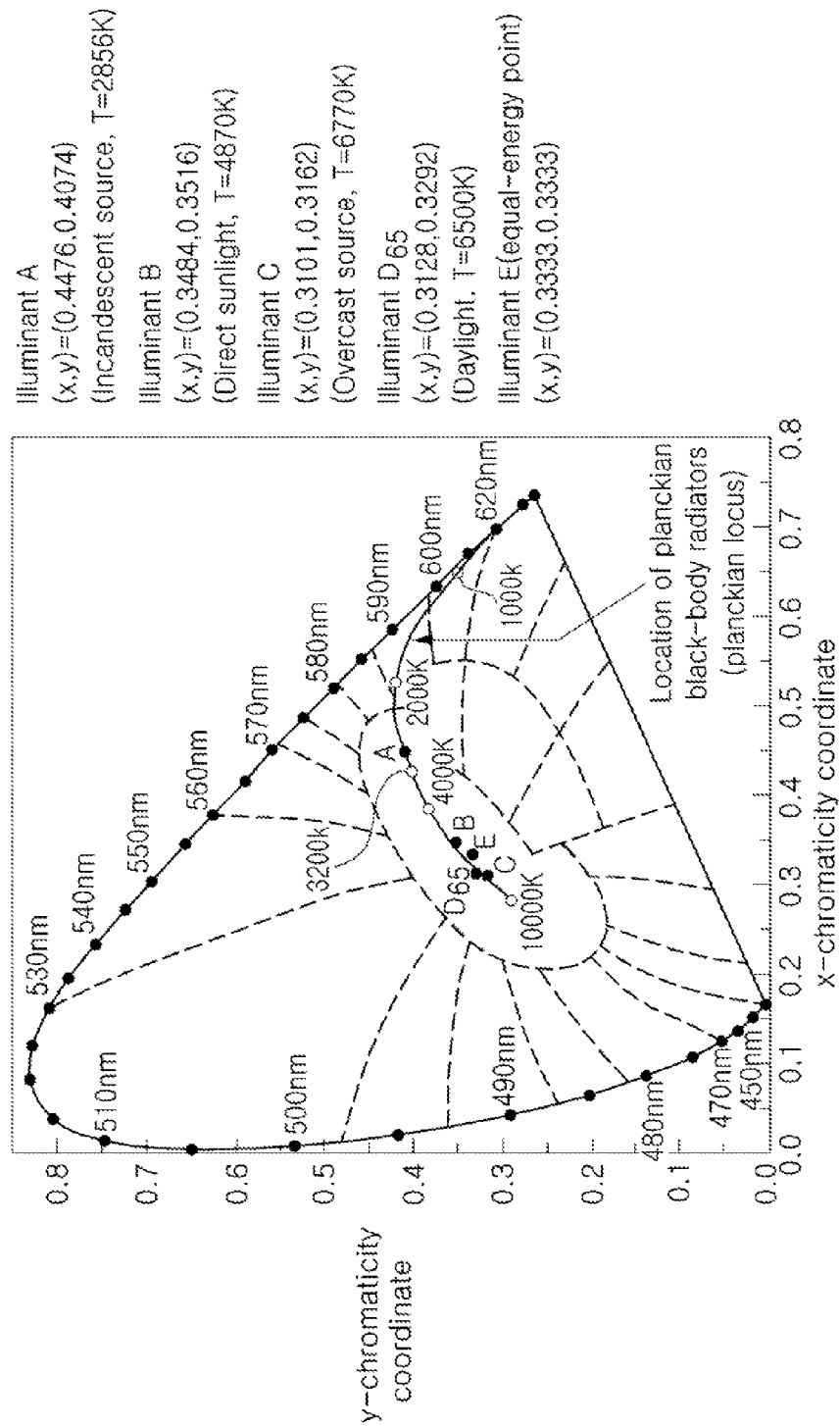
FIG. 18 is a view illustrating the CIE 1931 color space chromaticity diagram.

FIG. 17 illustrates a semiconductor light emitting device 2300 having an LED chip 2310 mounted on a mounting substrate 2320 as a light source that may be employed in the foregoing lighting device.

The mounting substrate 2320 may have a structure in which the flexible structure 110 is bonded to the heat dissipation structure 130 illustrated in FIG. 1.

The semiconductor light emitting device 2300 illustrated in FIG. 17 includes an LED chip 2310 mounted on a mounting substrate 2320. The LED chip 2310 is presented as an LED chip different from that of the example described above.

The LED chip 2310 includes a light emitting laminate S disposed in one surface of the substrate 2301 and first and second electrodes 2308$a$ and 2308$b$ disposed on the opposite side of the substrate 2301 based on the light emitting laminate S. Also, the LED chip 2310 includes an insulating part 2303 covering the first and second electrodes 2308$a$ and 2308$b$.

The first and second electrodes 2308$a$ and 2308$b$ may include first and second electrode pads 2319$a$ and 2319$b$ connected thereto by electrical connection parts 2309$a$ and 2309$b$.

The light emitting laminate S may include a first conductivity-type semiconductor layer 2304, an active layer 2305, and a second conductivity-type semiconductor layer 2306 sequentially disposed on the substrate 2301. The first electrode 2308$a$ may be provided as a conductive via connected to the first conductivity-type semiconductor layer 2304 through the second conductivity-type semiconductor layer 2306 and the active layer 2305. The second electrode 2308$b$ may be connected to the second conductivity-type semiconductor layer 2306.

A plurality of conductive vias may be formed in a single light emitting device 2300 region. The amount of vias and contact areas thereof may be adjusted such that the area occupied by the plurality of vias on the plane of the regions in which they are in contact with the first conductivity-type semiconductor layer 2104 ranges from 1% to 5% of the area of the light emitting device 2300 region. A radius of the via on the plane of the regions in which the conductive vias are in contact with the first conductivity-type semiconductor layer 2304 may range, for example, from 5 μm to 50 μm, and the number of vias may be 1 to 50 per light emitting device 2300 region according to a width of the light emitting device 2300 region. Although different according to a width of the light emitting device 2300 region, three or more vias may be provided. A distance between the vias may range from 100 μm to 500 μm, and the vias may have a matrix structure including rows and columns. Preferably, but not necessarily, the distance between the vias may range from 150 μm to 450 μm. If the distance between the vias is smaller than 100 μm, the amount of vias is increased to relatively reduce a light emitting area to lower luminous efficiency, and if the distance between the vias is greater than 500 μm, current spreading may suffer to degrade luminous efficiency. A depth of the vias may range from 0.5 μm to 5.0 μm, although the depth of the contact hole H V may vary according to a thickness of the second conductivity-type semiconductor layer and the active layer.

The first and second electrodes 2308a and 2308b are formed by depositing a conductive ohmic material on the light emitting laminate S. The first and second electrodes 2308a and 2308b may include at least one of silver (Ag), aluminum (Al), nickel (Ni), chromium (Cr), copper (Cu), gold (Au), palladium (Pd), platinum (Pt), tin (Sn), titanium (Ti), tungsten (W), rhodium (Rh), iridium (Ir), ruthenium (Ru), magnesium (Mg), zinc (Zn), and an alloy material thereof. For example, the second electrode 2308b may be an ohmic electrode formed of a silver (Ag) layer laminated on the basis of the second conductivity-type semiconductor layer 2306. The Ag ohmic electrode may serve as a reflective layer of light. A single layer of nickel (Ni), titanium (Ti), platinum (Pt), tungsten (W), or an alloy layer thereof may be alternatively laminated on the Ag layer. In detail, an Ni/Ti layer, a TiW/Pt layer, or a Ti/W layer may be laminated on an Ag layer, or these layers may be alternately laminated on the Ag layer.

As the first electrode 2308a, on the basis of the first conductivity-type semiconductor layer 2304, a Cr layer may be laminated and Au/Pt/Ti layers may be sequentially laminated on the Cr layer, or on the basis of the second conductivity-type semiconductor layer 2306, an Al layer is laminated and Ti/Ni/Au layers may be sequentially laminated on the Al layer.

The first and second electrodes 2308a and 2308b may be made of various other materials or may have various other lamination structures in order to enhance ohmic characteristics or reflecting characteristics.

The insulating part 2303 may have an open area exposing at least portions of the first and second electrodes 2308a and 2308b, and the first and second electrode pads 2319a and 2319b may be connected to the first and second electrodes 2308a and 2308b. The insulating part 2303 may be deposited to have a thickness ranging from 0.01 μm to 3 μm at a temperature equal to or lower than 500° C. through an SiO$_2$ and/or SiN CVD process.

The first and second electrodes 2308a and 2308b may be disposed in the same direction and, as described hereinafter, the first and second electrodes 2308a and 2308b may be mounted as a so-called flip-chip on a heat dissipation structure, or the like. In this case, the first and second electrodes 2308a and 2308b may be disposed such that they face in the same direction.

In particular, the first electrode 2308a may be connected to the first electrical connection part 2309a having a conductive via connected to the first conductivity-type semiconductor layer 2304 by passing through the second conductivity-type semiconductor layer 2306 and the active layer 2305 within the light emitting laminate S.

The amount, a shape, a pitch, a contact area with the first conductivity-type semiconductor layer 2304, and the like, of the conductive via and the first electrical connection part 2309a may be appropriately regulated in order to lower contact resistance, and the conductive via and the first electrical connection part 2309a may be arranged in rows and in columns to improve current flow.

Another electrode structure may include the second electrode 2308b directly formed on the second conductivity-type semiconductor layer 2306 and the second electrical connection portion 2309b formed on the second electrode 2308b. In addition to having a function of forming an electrical-ohmic connection with the second conductivity-type semiconductor layer 2306, the second electrode 2308b may be made of a light reflective material, whereby, as illustrated in FIG. 17, in a state in which the LED chip 2310 is mounted as a so-called flip chip structure, light emitted from the active layer 2305 can be effectively emitted in a direction of the substrate 2301. Of course, the second electrode 2308b may be made of a light-transmissive conductive material such as a transparent conductive oxide, according to a main light emitting direction.

The two electrode structures as described above may be electrically separated by the insulating part 2303. The insulating part 2303 may be made of any material as long as it has electrically insulating properties. Namely, the insulating part 2303 may be made of any material having electrically insulating properties, and here, preferably, but not necessarily, a material having a low degree of light absorption is used. For example, a silicon oxide or a silicon nitride such as SiO$_2$, SiO$_x$N$_y$, Si$_x$N$_y$, or the like, may be used. If necessary, a light reflective filler may be dispersed within the light-transmissive material to form a light reflective structure.

The first and second electrode pads 2319a and 2319b may be connected to the first and second electrical connection parts 2309a and 2309b to serve as external terminals of the LED chip 2310, respectively. For example, the first and second electrode pads 2319a and 2319b may be made of gold (Au), silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal thereof. In this case, when the LED chip is mounted on the mounting substrate 2301, the first and second electrode pads 2319a and 2319b may be bonded by using the eutectic metal, so solder bumps generally required for flip chip bonding may not be used. The use of a eutectic metal advantageously obtains superior heat dissipation effects in the mounting method in comparison to the case of using solder bumps. In this case, in order to obtain excellent heat dissipation effects, the first and second electrode pads 2319a and 2319b may be formed to occupy a relatively large area.

The substrate 2301 and the light emitting laminate S may be understood with reference to content described above with reference to FIG. 10, unless otherwise described. Also, although not shown, a buffer layer may be formed between the light emitting structure S and the substrate 2301. The buffer layer may be employed as an undoped semiconductor layer made of a nitride, or the like, to alleviate lattice defects of the light emitting structure grown thereon.

The substrate 2301 may have first and second main surfaces opposing one another, and an unevenness structure (i.e., a depression and protrusion pattern) may be formed on at least one of the first and second main surfaces. The unevenness structure formed on one surface of the substrate 2301 may be formed by etching a portion of the substrate 2301 so as to be made of the same material as that of the substrate 2301. Alternatively, the unevenness structure may be made of a heterogeneous material different from that of the substrate 2301.

In the present embodiment, since the unevenness structure is formed on the interface between the substrate 2301 and the first conductivity-type semiconductor layer 2304, paths of light emitted from the active layer 2305 can be of diverse, and thus, a light absorption ratio of light absorbed within the semiconductor layer can be reduced and a light scattering ratio can be increased, increasing light extraction efficiency.

In detail, the unevenness structure may be formed to have a regular or irregular shape. The heterogeneous material used to form the unevenness structure may be a transparent conductor, a transparent insulator, or a material having excellent reflectivity. Here, as the transparent insulator, a material such as $SiO_2$, $SiN_x$, $Al_2O_3$, HfO, $TiO_2$, or ZrO may be used. As the transparent conductor, a transparent conductive oxide (TCO) such as ZnO, an indium oxide containing an additive (e.g., Mg, Ag, Zn, Sc, Hf, Zr, Te, Se, Ta, W, Nb, Cu, Si, Ni, Co, Mo, Cr, Sn), or the like, may be used. As the reflective material, silver (Ag), aluminum (Al), or a distributed Bragg reflector (DBR) including multiple layers having different refractive indices, may be used. However, the present inventive concept is not limited thereto.

The substrate 2301 may be removed from the first conductivity-type semiconductor layer 2304. To remove the substrate 2301, a laser lift-off (LLO) process using a laser, an etching or a polishing process may be used. Also, after the substrate 2301 is removed, depressions and protrusions may be formed on the surface of the first conductivity-type semiconductor layer 1304.

As illustrated in FIG. 17, the LED chip 2310 is mounted on the mounting substrate 2320. The mounting substrate 2320 includes upper and lower electrode layers 2312b and 2312a formed on upper and lower surfaces of the substrate body 2311, and vias 2313 penetrating through the substrate body 2311 to connect the upper and lower electrode layers 2312b and 2312a. The substrate body 2311 may be made of a resin, a ceramic, or a metal, and the upper or lower electrode layer 2312b or 2312a may be a metal layer made of gold (Au), copper (Cu), silver (Ag), or aluminum (Al).

Of course, the substrate on which the foregoing LED chip 2310 is mounted is not limited to the configuration of the mounting substrate 2320 illustrated in FIG. 17, and any substrate having a wiring structure for driving the LED chip 2310 may be employed.

<Other Examples of Light Emitting Devices>

LED chips having various structures other than that of the foregoing LED chip described above may also be used. For example, an LED chip in which surface-plasmon polaritons (SPP) are formed in a metal-dielectric boundary of an LED chip to interact with quantum well excitons, thus obtaining significantly improved light extraction efficiency, may also be advantageously used.

Meanwhile, the light emitting device 200 may be configured to include at least one of a light emitting device emitting white light by combining yellow, green, red, and orange phosphors with a blue LED chip and a purple, blue, green, red, and infrared light emitting device. In this case, the light emitting device 200 may control a color rendering index (CRI) to range from a sodium-vapor (Na) lamp level (40) to a sunlight level (100), or the like, and control a color temperature ranging from 2000K to 20000K level to generate various levels of white light. If necessary, the light emitting device 200 may generate visible light having purple, blue, green, red, orange colors, or infrared light to adjust an illumination color according to a surrounding atmosphere or mood. Also, the light emitting device may generate light having a special wavelength stimulating plant growth.

White light generated by combining yellow, green, red phosphors to a blue LED and/or combining at least one of a green LED and a red LED thereto may have two or more peak wavelengths and may be positioned in a segment linking (x, y) coordinates (0.4476, 0.4074), (0.3484, 0.3516), (0.3101, 0.3162), (0.3128, 0.3292), (0.3333, 0.3333) of a CIE 1931 chromaticity diagram illustrated in FIG. 14. Alternatively, white light may be positioned in a region surrounded by a spectrum of black body radiation and the segment. A color temperature of white light corresponds to a range from about 2000K to about 20000K.

Phosphors may have the following empirical formula and colors.

Oxide-based phosphors: Yellow and green $Y_3Al_5O_{12}$:Ce, $Tb_3Al_5O_{12}$:Ce, $Lu_3Al_5O_{12}$:Ce Silicate-based phosphors: Yellow and green $(Ba,Sr)_2SiO_4$:Eu, yellow and orange $(Ba,Sr)_3SiO_5$:Ce Nitride-based phosphors: Green β-SiAlON:Eu, yellow $L_3Si_6O_{11}$:Ce, orange α-SiAlON:Eu, red $CaAlSiN_3$:Eu, $Sr_2Si_5N_8$:Eu, $SrSiAl_4N_7$:Eu Fluoride-based phosphors: KSF-based red $K_2SiF_6$:Mn4+

Phosphor compositions should be basically conformed with Stoichiometry, and respective elements may be substituted with different elements of respective groups of the periodic table. For example, strontium (Sr) may be substituted with barium (Ba), calcium (Ca), magnesium (Mg), or the like, of alkali earths, and yttrium (Y) may be substituted with terbium (Tb), Lutetium (Lu), scandium (Sc), gadolinium (Gd), or the like. Also, europium (Eu), an activator, may be substituted with cerium (Ce), terbium (Tb), praseodymium (Pr), erbium (Er), ytterbium (Yb), or the like, according to a desired energy level, and an activator may be applied alone, or a coactivator, or the like, may be additionally applied to change characteristics.

Also, materials such as quantum dots, or the like, may be applied as materials that replace phosphors, and phosphors and quantum dots may be used in combination or alone in an LED.

A quantum dot may have a structure including a core (3 nm to 10 nm) such as CdSe, InP, or the like, a shell (0.5 nm to 2 nm) such as ZnS, ZnSe, or the like, and a ligand for stabilizing the core and the shell, and may implement various colors according to sizes.

Table 1 below shows types of phosphors in applications fields of white light emitting devices using a blue LED (wavelength: 440 nm to 460 nm).

TABLE 1

| Purpose | Phosphors |
| --- | --- |
| LED TV BLU | β-SiAlON: Eu2+ |
| | (Ca, Sr)AlSiN3: Eu2+ |
| | L3Si6O11: Ce3+ |
| | K2SiF6: Mn4+ |
| Lighting Devices | Lu3Al5O12: Ce3+ |
| | Ca-α-SiAlON: Eu2+ |
| | L3Si6N11: Ce3+ |
| | (Ca, Sr)AlSiN3: Eu2+ |
| | Y3Al5O12: Ce3+ |
| | KSF-based red K2SiF6: Mn4+ |
| Side Viewing | Lu3Al5O12: Ce3+ |
| (Mobile, Notebook PC) | Ca-α-SiAlON: Eu2+ |
| | L3Si6N11: Ce3+ |
| | (Ca, Sr)AlSiN3: Eu2+ |

TABLE 1-continued

| Purpose | Phosphors |
| --- | --- |
| Electrical Components (Vehicle Head Lamp, etc.) | Y3Al5O12: Ce3+<br>(Sr, Ba, Ca, Mg)2SiO4: Eu2+<br>Lu3Al5O12: Ce3+<br>Ca-α-SiAlON: Eu2+<br>L3Si6N11: Ce3+<br>K2SiF6: Mn4+ |

Phosphors or quantum dots may be applied by using at least one of a method of being sprayed onto a light emitting device, a method of covering as a film, and a method of attaching as a sheet of ceramic phosphor, or the like.

As the spraying method, dispensing, spray coating, or the like, is generally used, and dispensing includes a pneumatic method and a mechanical method such as a screw fastening scheme, a linear type fastening scheme, or the like. Through a jetting method, an amount of dotting may be controlled through a very small amount of discharging and color coordinates (or chromaticity) may be controlled therethrough. In the case of a method of collectively applying phosphors on a wafer level or on a mounting board on which an LED is mounted, productivity can be enhanced and a thickness can be easily controlled.

The method of directly covering a light emitting device with phosphors or quantum dots as a film may include electrophoresis, screen printing, or a phosphor molding method, and these methods may have a difference according to whether a lateral surface of a chip is required to be coated or not.

Meanwhile, in order to control efficiency of a long wavelength light emitting phosphor re-absorbing light emitted in a short wavelength, among two types of phosphors having different light emitting wavelengths, two types of phosphor layer having different light emitting wavelengths may be provided, and in order to minimize re-absorption and interference of chips and two or more wavelengths, a Distributed Bragg Reflector (DBR) or an Omni-directional Reflector (ODR) layer may be included between respective layers. In order to form a uniformly coated film, after a phosphor is fabricated as a film or a ceramic form and attached to a chip or a light emitting device.

In order to differentiate light efficiency and light distribution characteristics, a light conversion material may be positioned in a remote form, and in this case, the light conversion material may be positioned together with a material such as a light-transmissive polymer, glass, or the like, according to durability and heat resistance.

A phosphor application technique plays the most important role in determining light characteristics in an LED device, so techniques of controlling a thickness of a phosphor application layer, a uniform phosphor distribution, and the like, have been variously researched.

A quantum dot (QD) may also be positioned in a light emitting device in the same manner as that of a phosphor, and may be positioned in glass or a light-transmissive polymer material to perform optical conversion.

Meanwhile, in order to protect a light emitting device from an external environment or in order to improve light extraction efficiency of light emitted to the outside of a light emitting device, a light-transmissive material may be positioned on the light emitting device as a filler. In this case, a transparent organic solvent such as epoxy, silicon, a hybrid of epoxy and silicon, or the like, is applied as a light-transmissive material, and the light-transmissive material may be cured according to heating, light irradiation, a time-lapse method, or the like.

In the case of silicon, polydimethyl siloxane is classified as a methyl-based silicon and polymethylphenyl siloxane is classified as a phenyl-based silicon. The methyl-based silicon and the phenyl-based silicon have differences in refractive indexes, water vapor transmission rates, light transmittance amounts, light fastness qualities, and thermostability. Also, the methyl-based silicon and the phenyl-based silicon have differences in curing speeds according to a cross linker and a catalyst, affecting phosphor distribution.

Light extraction efficiency varies according to a refractive index of a filler, and in order to minimize a gap between a refractive index of the outermost medium of a chip in a portion from which blue light is emitted and a refractive index of a portion emitted to air, two or more types of silicon having different refractive indices may be sequentially laminated.

In general, the methyl-based silicon has the highest level of thermostability, and variations in a temperature increase are reduced in order of phenyl-based silicon, hybrid silicon, and epoxy silicon. Silicon may be classified as a gel-type silicon, an elastomer-type silicon, and a resin-type silicon according to the degree of hardness thereof.

The light emitting device may further include an optical element for radially guiding light irradiated from a light source unit. In this case, a previously formed optical element may be attached to a light emitting device, or a fluidic organic solvent may be injected into a mold with a light emitting device mounted therein and solidified.

The optical element attachment method includes directly attaching an optical element to a filler, bonding only an upper portion of a chip or an outer portion of a light emitting device or an outer portion of the optical element, spaced apart from the filler, and the like. As the method of mold injection, injection molding, transfer molding, compression molding, or the like, may be used. Light distribution characteristics may be changed according to lens shapes (concave, convex, uneven, conical, and geometrical structures), and the optical element may be modified according to efficiency and light distribution characteristics.

In the present embodiment, the lighting device 200 is illustrated as a single package unit including an LED chip provided therein. However, the present inventive concept is not limited thereto and, for example, the light emitting device may be an LED chip itself. In this case, the LED chip may be a Chip-On-Board (COB) type chip mounted on the substrate and directly electrically connected to the substrate through a flip chip bonding method or a wire bonding method.

A lighting system employing the foregoing lighting device will be described with reference to FIGS. 19 through 22. The lighting system according to the present embodiment, utilizing the embodiment of the lighting device of FIGS. 5 through 13, may automatically regulate a color temperature according to a surrounding environment (e.g., temperature and humidity) and provide a lighting device as mood lighting meeting the needs of human moods, rather than serving as simple lighting.

Figure 19:
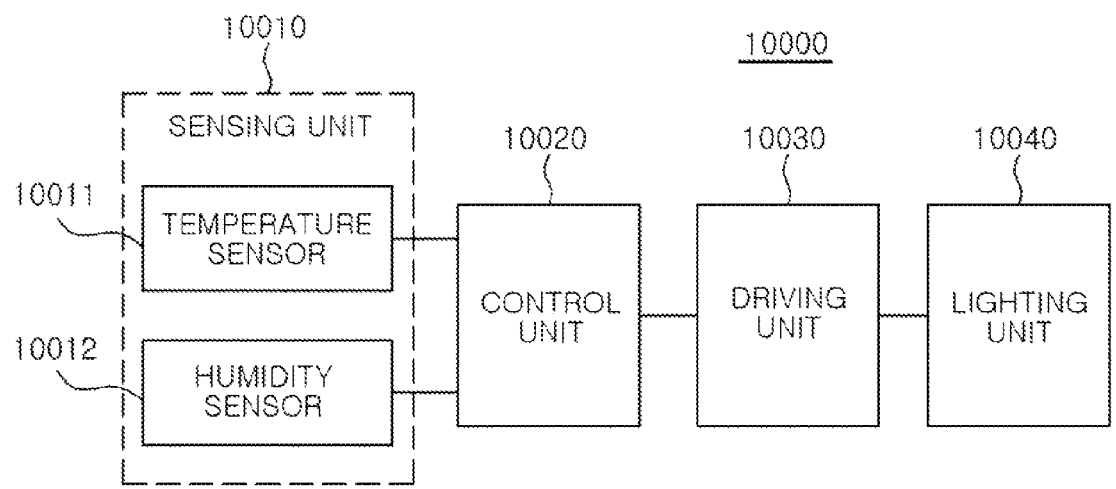
FIG. 19 is a block diagram schematically illustrating a lighting system according to an embodiment of the present inventive concept.

FIG. 19 is a block diagram schematically illustrating a lighting system according to an embodiment of the present inventive concept.

Referring to FIG. 19, a lighting system 10000 according to an embodiment of the present inventive concept may include a sensing unit 10010, a control unit 10020, a driving unit 10030, and a lighting unit 10040.

The sensing unit 10010 may be installed in an indoor or outdoor area, and may have a temperature sensor 10011 and a humidity sensor 10012 to measure at least one air condition among ambient temperature and humidity. The sensing unit 10010 delivers the measured air condition information, i.e., the measured temperature and humidity, to the control unit 10020 electrically connected thereto.

The control unit 10020 may compare the measured air temperature and humidity with air conditions (temperature and humidity ranges) previously set by a user, and determine a color temperature of the lighting unit 10040 corresponding to the air condition. To this end, the control unit 10020 may be electrically connected to the driving unit 10030, and control the lighting unit 10040 to be driven at the determined color temperature.

Figure 20:
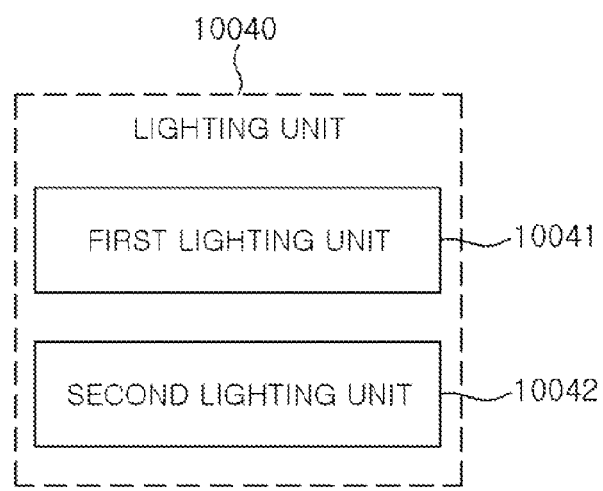
FIG. 20 is a block diagram schematically illustrating a detailed configuration of a lighting unit of the lighting system illustrated in FIG. 19.

The lighting unit 10040 operates according to power supplied by the driving unit 10030. The lighting unit 10040 may include at least one lighting device illustrated in FIGS. 7 to 13. For example, as illustrated in FIG. 20, the lighting unit 10040 may include a first lighting device 10041 and a second lighting device 10042 having different color temperatures, and each of the lighting devices 10041 and 10042 may include a plurality of light emitting devices emitting the same white light.

The first lighting device 10041 may emit white light having a first color temperature, and the second lighting device 10042 may emit white light having a second color temperature, and here, the first color temperature may be lower than the second color temperature. Conversely, the first color temperature may be higher than the second color temperature. Here, white color having a relatively low color temperature corresponds to a warm white color, and white color having a relatively high color temperature corresponds to a cold white color. When power is supplied to the first and second lighting devices 10041 and 10042, the first and second lighting devices 10041 and 10042 emit white light having first and second color temperatures, respectively, and the respective white light may be mixed to implement white light having a color temperature determined by the control unit 10020.

In detail, in a case in which the first color temperature is lower than the second color temperature, if the color temperature determined by the control unit 10020 is relatively high, an amount of light from the first lighting device 10041 may be reduced and an amount of light from the second lighting device 10042 may be increased to implement mixed white light having the determined color temperature. Conversely, when the determined color temperature is relatively low, an amount of light from the first lighting device 10041 may be increased and an amount of light from the second lighting device 10042 may be reduced to implement white light having the determined color temperature. Here, the amount of light from each of the lighting devices 10041 and 10042 may be implemented by differently regulating an amount of power supplied from the driving unit 10030 or may be implemented by regulating the number of lighted light sources.

Figure 21:
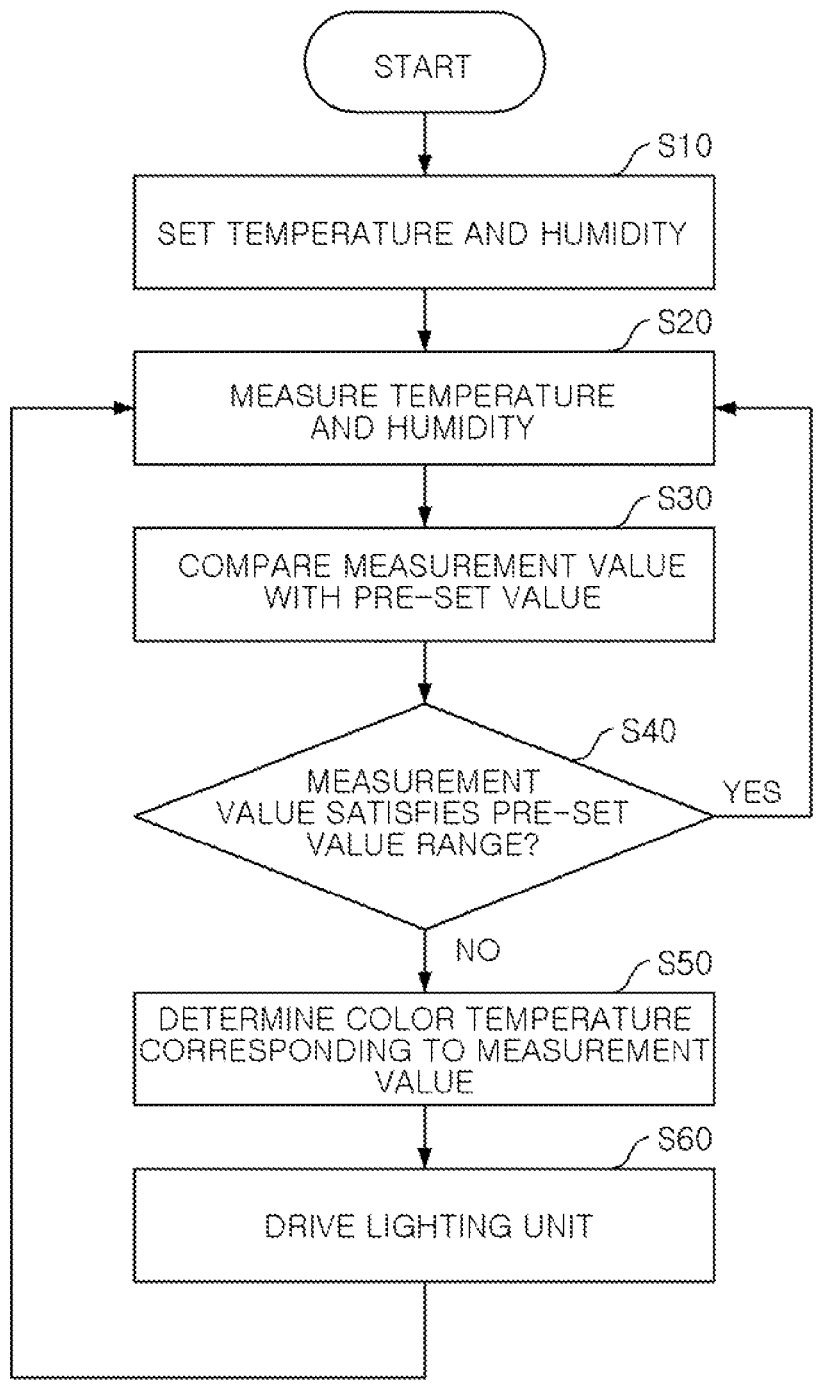
FIG. 21 is a flow chart illustrating a method for controlling the lighting system illustrated in FIG. 19.

FIG. 21 is a flowchart illustrating a method for controlling the lighting system of FIG. 19. Referring to FIG. 21, first, the user sets a color temperature according to temperature and humidity ranges through the control unit 10020 (S10). The set temperature and humidity data are stored in the control unit 10020.

In general, when a color temperature is equal to or greater than 6000K, a color providing a cool feeling, such as blue, may be produced, and when a color temperature is less than 4000K, a color providing a warm feeling, such as red, may be produced. Thus, in the present embodiment, when temperature and humidity exceed 20° C. and 60%, respectively, the user may set the lighting unit 10040 to be turned on to have a color temperature higher than 6000K through the control unit 10020, when temperature and humidity range from 10° C. to 20° C. and 40% to 60%, respectively, the user may set the lighting unit 10040 to be turned on to have a color temperature ranging from 4000K to 6000K through the control unit 10020, and when temperature and humidity are lower than 10° C. and 40%, respectively, the user may set the lighting unit 10040 to be turned on to have a color temperature lower than 4000K through the control unit 10020.

Next, the sensing unit 10010 measures at least one of conditions among ambient temperature and humidity (S20). The temperature and humidity measured by the sensing unit 10010 are delivered to the control unit 10020.

Subsequently, the control unit 10020 compares the measurement values delivered from the sensing unit 10010 with pre-set values, respectively (S30). Here, the measurement values are temperature and humidity data measured by the sensing unit 10010, and the set values are temperature and humidity data which have been set by the user and stored in the control unit 10020 in advance. Namely, the control unit 10020 compares the measured temperature and humidity with the pre-set temperature and humidity.

According to the comparison results, the control unit 10020 determines whether the measurement values satisfy the pre-set ranges (S40). When the measurement values satisfy the pre-set values, the control unit 10020 maintains a current color temperature, and measures again temperature and humidity (S20). Meanwhile, when the measurement values do not satisfy the pre-set values, the control unit 10020 detects pre-set values corresponding to the measurement values, and determines a corresponding color temperature (S50). The control unit 10020 controls the driving unit 10030 to cause the lighting unit 10040 to be driven at the determined color temperature.

Then, the driving unit 10030 drives the lighting unit 10040 to have the determined color temperature (S60). That is, the driving unit 10030 supplies required power to drive the lighting unit 10040 to implement the predetermined color temperature. Accordingly, the lighting unit 10040 may be adjusted to have a color temperature corresponding to the temperature and humidity previously set by the user according to ambient temperature and humidity.

In this manner, the lighting system 10000A is able to automatically regulate a color temperature of the indoor lighting according to changes in ambient temperature and humidity, thereby satisfying human moods varied according to changes in the surrounding natural environment and providing psychological stability.

Figure 22:
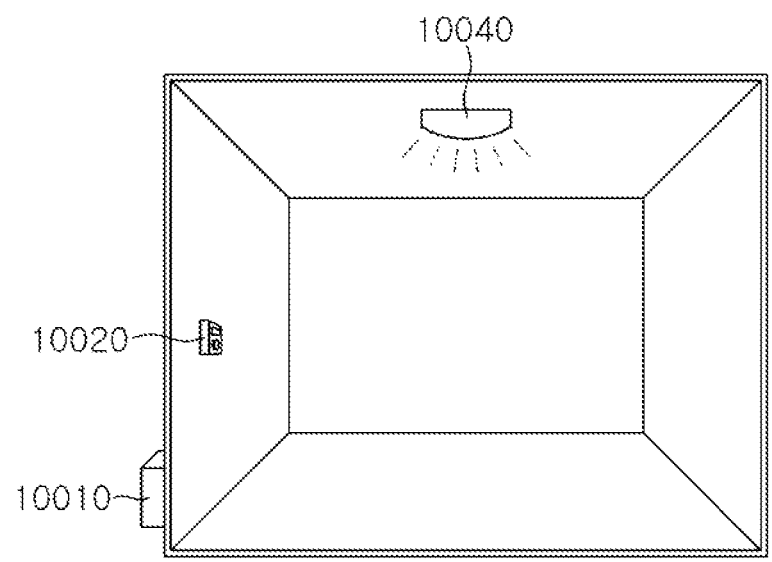
FIG. 22 is a view schematically illustrating the way in which the lighting system illustrated in FIG. 19 is used.

FIG. 22 is a view schematically illustrating the use of the lighting system of FIG. 19. As illustrated in FIG. 22, the lighting unit 10040 may be installed on the ceiling as an indoor lamp. Here, the sensing unit 10010 may be may be implemented as a separate device and installed on an external wall in order to measure outdoor temperature and humidity. The control unit 10020 may be installed in an indoor area to allow the user to easily perform setting and ascertainment operations. The lighting system is not limited thereto, but may be installed on the wall in the place of an interior illumination device or may be applicable to a lamp, such as a desk lamp, or the like, that can be used in indoor and outdoor areas.

Hereinafter, another example of a lighting system using the foregoing lighting device will be described with reference to FIGS. 23 through 30. The lighting system according to the present embodiment may automatically perform a predetermined control by detecting a motion of a monitored target and an intensity of illumination at a location of the monitored target.

Figure 23:
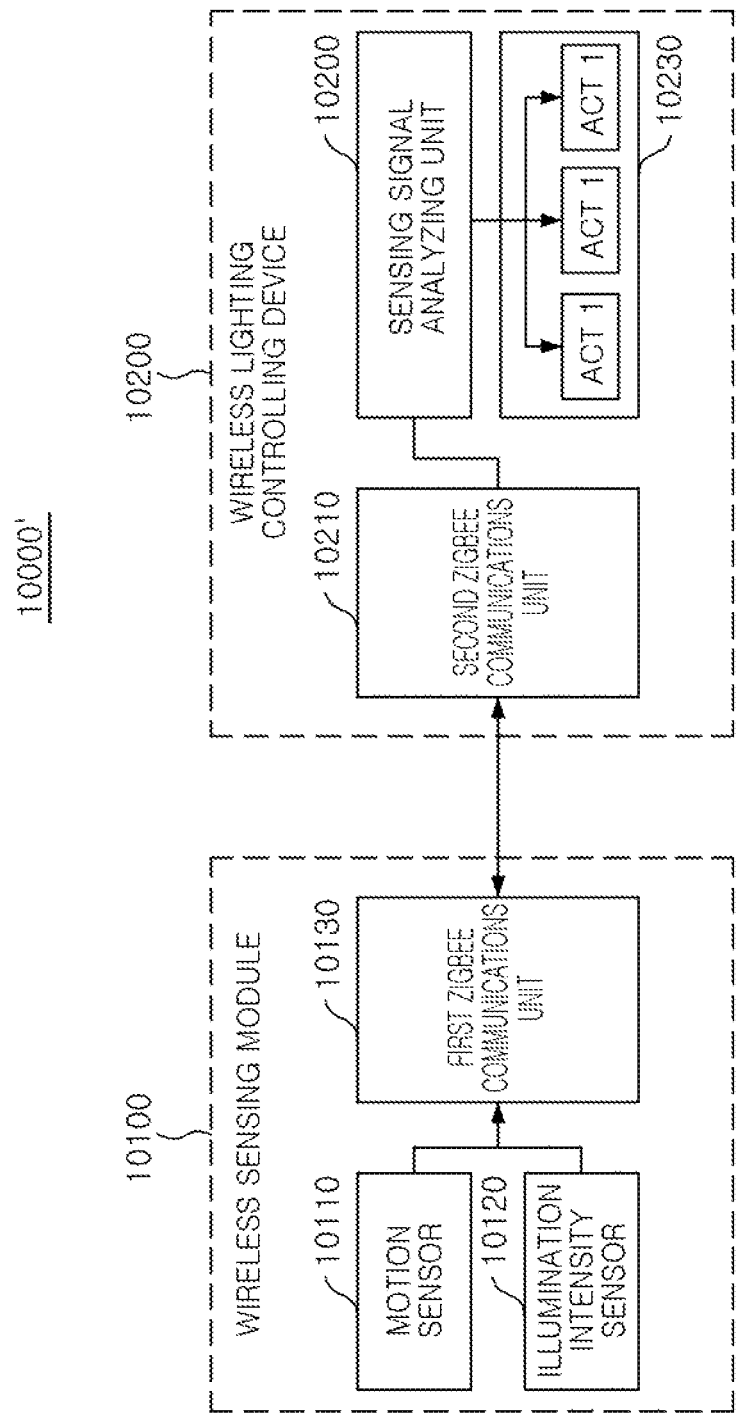
FIG. 23 is a block diagram of a lighting system according to another embodiment of the present inventive concept.

FIG. 23 is a block diagram of a lighting system according to another embodiment of the present inventive concept.

Referring to FIG. 23, a lighting system 10000' according to the present embodiment may include a wireless sensing module 10100 and a wireless lighting controlling device 10200.

The wireless sensing module 10100 may include a motion sensor 10110, an illumination intensity sensor 10120 sensing an intensity of illumination, and a first wireless communications unit generating a wireless signal that includes a motion sensing signal from the motion sensor 10110 and an illumination intensity sensing signal from the illumination intensity sensor 10120 and that complies with a predetermined communications protocol, and transmitting the same. For example, the first wireless communications unit may be configured as a first ZigBee communications unit 10130 generating a ZigBee signal that complies with a pre-set communications protocol and transmitting the same.

The wireless lighting controlling device 10200 may include a second wireless communications unit receiving the wireless signal from the first wireless communications unit and restoring a sensing signal, a sensing signal analyzing unit 10220 analyzing the sensing signal from the second wireless communications unit, and an operation control unit 10230 performing a predetermined control based on analysis results from the sensing signal analyzing unit 10220. The second wireless communications unit may be configured as a second ZigBee communications unit 10210 receiving the ZigBee signal from the first ZigBee communications unit 10130 and restoring a sensing signal.

Figures 24, 25:
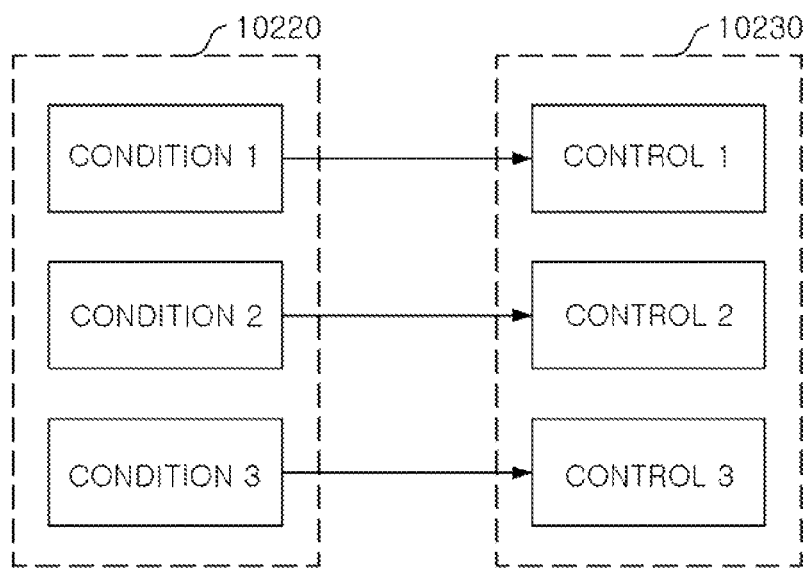
FIG. 24 is a view illustrating a format of a ZigBee signal according to an embodiment of the present inventive concept.
FIG. 25 is a view illustrating a sensing signal analyzing unit and an operation control unit according to an embodiment of the present inventive concept.

FIG. 24 is a view illustrating a format of a ZigBee signal according to an embodiment of the present inventive concept.

Referring to FIG. 24, the ZigBee signal from the first ZigBee communications unit 10130 may include channel information (CH) defining a communications channel, wireless network identification (ID) information (PAN_ID) defining a wireless network, a device address (Ded_Add) designating a target device, and sensing data including the motion and illumination intensity sensing signals.

Also, the ZigBee signal from the second ZigBee communications unit 10210 may include channel information (CH) defining a communications channel, wireless network identification (ID) information (PAN_ID) defining a wireless network, a device address (Ded_Add) designating a target device, and sensing data including the motion and illumination intensity sensing signals.

The sensing signal analyzing unit 10220 may analyze the sensing signal from the second ZigBee communications unit 10210 to detect a satisfied condition, among a plurality of conditions, based on the sensed motion and the sensed intensity of illumination.

Here, the operation control unit 10230 may set a plurality of controls based on the plurality of conditions that are previously set by the sensing signal analyzing unit 10220, and perform a control corresponding to the condition detected by the sensing signal analyzing unit 10220.

FIG. 25 is a view illustrating the sensing signal analyzing unit and the operation control unit according to the embodiment of the present inventive concept.

Referring to FIG. 25, for example, the sensing signal analyzing unit 10220 may analyze the sensing signal from the second ZigBee communications unit 10210 and detect a satisfied condition among first, second, and third conditions (condition 1, condition 2, and condition 3), based on the sensed motion and sensed intensity of illumination.

In this case, the operation control unit 10230 may set first, second and third controls (control 1, control 2, and control 3) corresponding to the first, second, and third conditions (condition 1, condition 2, and condition 3) previously set by the sensing signal analyzing unit 10220, and perform a control corresponding to the condition detected by the sensing signal analyzing unit 10220.

Figure 26:
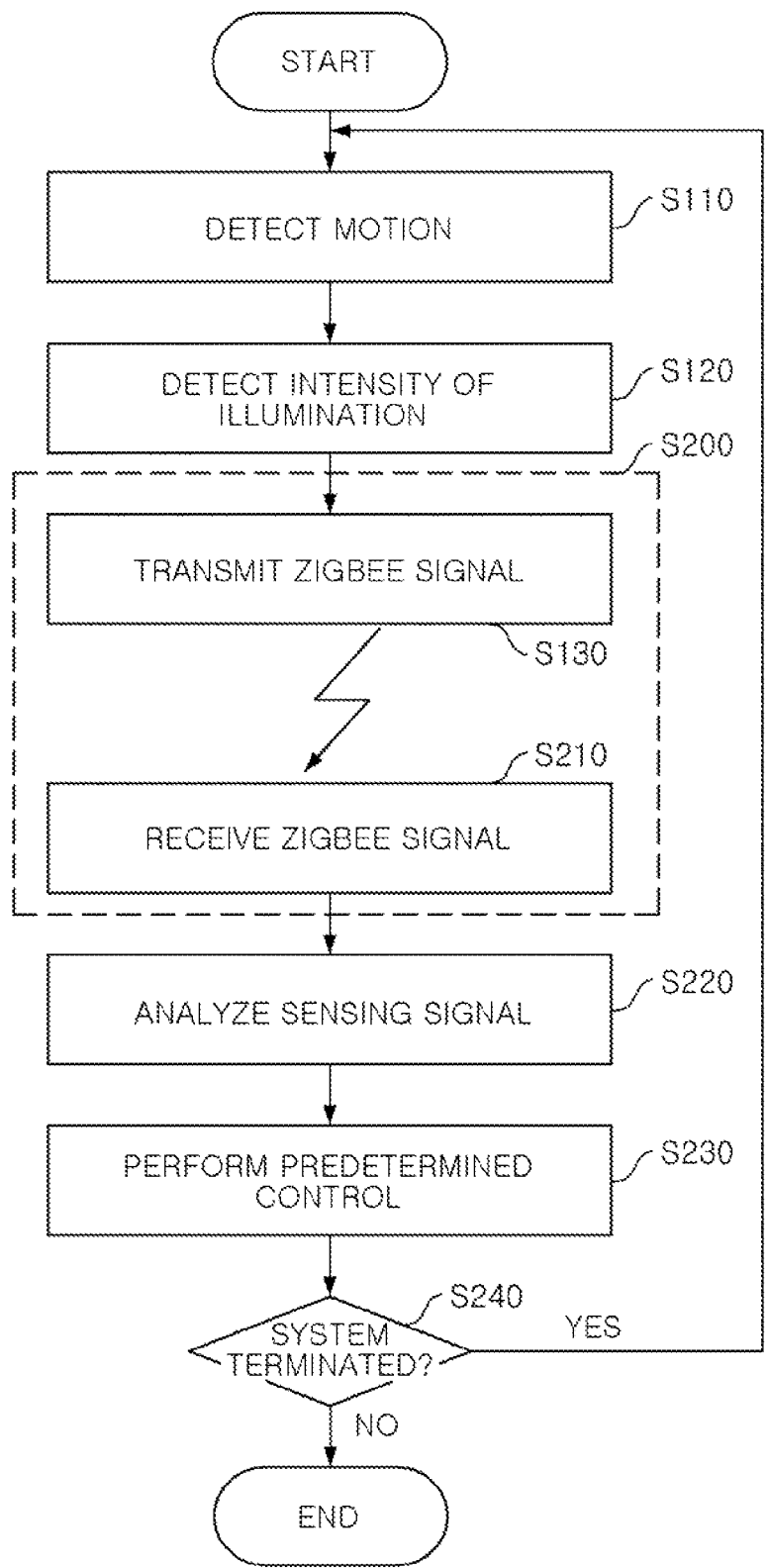
FIG. 26 is a flow chart illustrating an operation of a wireless lighting system according to an embodiment of the present inventive concept.

FIG. 26 is a flowchart illustrating an operation of a wireless lighting system according to an embodiment of the present inventive concept.

In FIG. 26, in operation 5110, the motion sensor 10110 detects a motion. In operation S120, the illumination intensity sensor 10120 detects an intensity of illumination. Operation 5200 is a process of transmitting and receiving a ZigBee signal. Operation 5200 may include operation S130 of transmitting a ZigBee signal by the first ZigBee communications unit 10130 and operation S210 of receiving the ZigBee signal by the second ZigBee communications unit 10210. In operation S220, the sensing signal analyzing unit 10220 analyzes a sensing signal. In operation S230, the operation control unit 10230 performs a predetermined control. In operation 5240, whether the lighting system is terminated is determined.

Operations of the wireless sensing module and the wireless lighting controlling device utilizing the embodiment of the lighting device of FIGS. 5 through 13 according to an embodiment of the present inventive concept will be described with reference to FIGS. 23 through 26.

First, the wireless sensing module 10100 of the wireless lighting system according to an embodiment of the present inventive concept will be described with reference to FIGS. 23, 24, and 26. The wireless lighting system 10100 according to the present embodiment is installed within the lighting device of FIGS. 5 through 13 or in a location in which the lighting device of FIGS. 5 through 13 is installed, to detect a current intensity of illumination of the lighting device and detect human motion near the lighting device.

Namely, the motion sensor 10110 of the wireless sensing module 10100 is configured as an infrared sensor, or the like, capable of sensing a human. The motion sensor 10100 senses a motion and provides the same to the first ZigBee communications unit 10130 (5110 in FIG. 14). The illumination intensity sensor 10120 of the wireless sensing module 10100 senses an intensity of illumination and provides the same to the first ZigBee communications unit 10130 (S120).

Accordingly, the first ZigBee communications unit 10130 generates a ZigBee signal that includes the motion sensing signal from the motion sensor 10100 and the illumination intensity sensing signal from the illumination intensity sensor 10120 and that complies with a pre-set communications protocol, and transmits the generated ZigBee signal wirelessly (S130).

Referring to FIG. 24, the ZigBee signal from the first ZigBee communications unit 10130 may include channel information (CH) defining a communications channel, wireless network identification (ID) information (PAN_ID) defining a wireless network, a device address (Ded_Add) designating a target device, and sensing data, and here, the sensing data includes a motion value and an illumination intensity value.

Next, the wireless lighting controlling device 10200 of the wireless lighting system according to an embodiment of the present inventive concept will be described with reference to FIGS. 23 through 26. The wireless lighting controlling device 10200 of the wireless lighting system according to the present embodiment may control a predetermined operation according to an illumination intensity value and a motion value included in a ZigBee signal from the wireless sensing module 10100.

Namely, the second ZigBee communications unit 10210 of the wireless lighting controlling device 10200 according to the present embodiment receives the ZigBee signal from the first ZigBee communications unit 10130, restores a sensing signal therefrom, and provides the restored sensing signal to the sensing signal analyzing unit 10200 (S210 in FIG. 14).

Referring to FIG. 24, the ZigBee signal from the second ZigBee communications unit 10210 may include channel information (CH) defining a communications channel, wireless network identification (ID) information (PAN_ID) defining a wireless network, a device address (Ded_Add) designating a target device, and sensing data. A wireless network may be identified based on the channel information (CH) and the wireless network ID information (PAN_ID), and a sensed device may be recognized based on the device address. The sensing data includes a motion value and an illumination intensity value.

Also, referring to FIG. 23, the sensing signal analyzing unit 10220 analyzes the illumination intensity value and the motion value included in the sensing signal from the second ZigBee communications unit 10210 and provides the analysis results to the operation control unit 10230 (S220 in FIG. 14).

Accordingly, the operation control unit 10230 may perform a predetermined control according to the analysis results from the sensing signal analyzing unit 10220 (S230).

The sensing signal analyzing unit 10220 may analyze the sensing signal from the second ZigBee communications unit 10210 and detect a satisfied condition, among a plurality of conditions, based on the sensed motion and the sensed intensity of illumination. Here, the operation control unit 10230 may set a plurality of controls corresponding to the plurality of conditions set in advance by the sensing signal analyzing unit 10220, and perform a control corresponding to the condition detected by the sensing signal analyzing unit 10220.

For example, referring to FIG. 25, the sensing signal analyzing unit 10220 may detect a satisfied condition among the first, second, and third conditions (condition 1, condition 2, and condition 3) based on the sensed motion and the sensed intensity of illumination by analyzing the sensing signal from the second ZigBee communications unit 10210.

In this case, the operation control unit 10230 may set first, second, and third controls (control 1, control 2, and control 3) corresponding to the first, second, and third conditions (condition 1, condition 2, and condition 3) set in advance by the sensing signal analyzing unit 10220, and perform a control corresponding to the condition detected by the sensing signal analyzing unit 10220.

For example, when the first condition (condition 1) corresponds to a case in which human motion is sensed at a front door and an intensity of illumination at the front door is not low (not dark), the first control may turn off all predetermined lamps. When the second condition (condition 2) corresponds to a case in which human motion is sensed at the front door and an intensity of illumination at the front door is low (dim), the second control may turn on some pre-set lamps (i.e., some lamps at the front door and some lamps in a living room). When the third condition (condition 3) corresponds to a case in which human motion is sensed at the front door and an intensity of illumination at the front door is very low (a very dark environment), the third control may turn on all pre-set lamps.

Unlike the foregoing cases, besides the operation of turning lamps on or off, the first, second, and third controls may be variously applied according to pre-set operations. For example, the first, second, and third controls may be associated with operations of a lamp and an air-conditioner in summer or may be associated with operations of a lamp and heating in winter.

Other examples of a lighting system will be described with reference to FIGS. 27 through 30.

Figure 27:
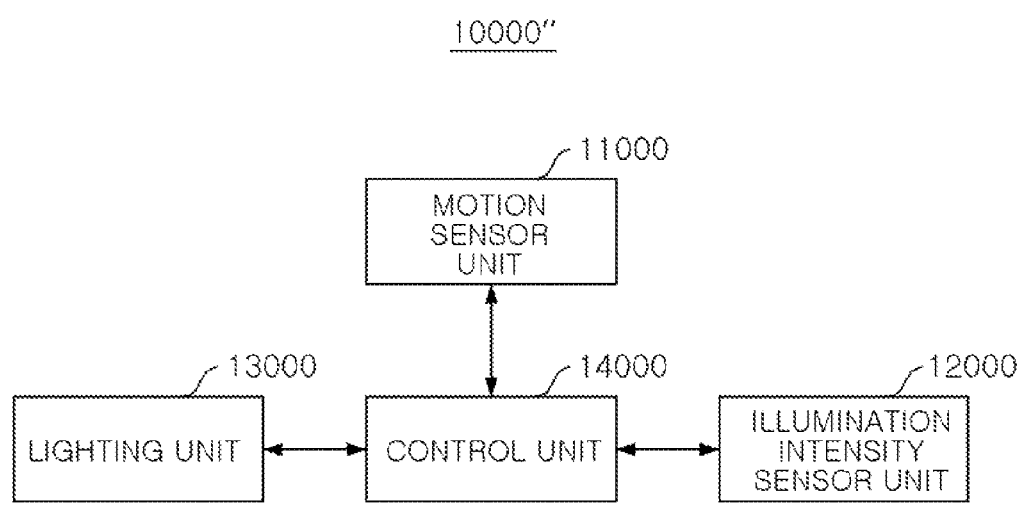
FIG. 27 is a block diagram schematically illustrating components of a lighting system according to another embodiment of the present inventive concept.

FIG. 27 is a block diagram schematically illustrating constituent elements of a lighting system according to another embodiment of the present inventive concept. A lighting system 10000″ according to the present embodiment may include a motion sensor unit 11000, an illumination intensity sensor unit 12000, a lighting unit 13000, and a control unit 14000.

The motion sensor unit 11000 senses a motion of an object. For example, the lighting system may be attached to a movable object, such as, for example, a container or a vehicle, and the motion sensor unit 11000 may sense a motion of the moving object. When the motion of the object to which the lighting system is attached is sensed, the motion sensor unit 11000 outputs a signal to the control unit 14000 and the lighting system is activated. The motion sensor unit 11000 may include an accelerometer, a geomagnetic sensor, or the like.

The illumination intensity sensor unit 12000, a type of optical sensor, measures an intensity of illumination of a surrounding environment. When the motion sensor unit 11000 senses the motion of the object to which the lighting system is attached, the illumination intensity sensor unit 12000 is activated according to a signal output by the control unit 14000. The lighting system illuminates during night work or in a dark environment to call a worker or an operator's attention to their surroundings, and allows a driver to see at night. Thus, even when the motion of the object to which the lighting system is attached is sensed, if an intensity of illumination higher than a predetermined level (during the day), the lighting system is not required to illuminate. Also, even in the daytime, if it rains, the intensity of illumination may be fairly low, so there is a need to inform a worker or an operator about a movement of a container, and thus, the lighting unit is required to emit light. Thus, whether to turn on the lighting unit 13000 is determined according to an illumination intensity value measured by the illumination intensity sensor unit 12000.

The illumination intensity sensor unit 12000 measures an intensity of illumination of a surrounding environment and outputs the measured value to the control unit 14000. Meanwhile, when the illumination intensity value is equal to or higher than a pre-set value, the lighting unit 13000 is not required to emit light, so the overall system is terminated.

When the illumination intensity value measured by the illumination intensity sensor unit 12000 is lower than the pre-set value, the lighting unit 13000 emits light. The worker or the operator may recognize the light emissions from the lighting unit 1300 to recognize the movement of the container, or the like. As the lighting unit 13000, the foregoing lighting device may be employed.

Also, the lighting unit 13000 may adjust intensity of light emissions thereof according to the illumination intensity value of the surrounding environment. When the illumination intensity value of the surrounding environment is low, the lighting unit 13000 may increase the intensity of light emissions thereof, and when the illumination intensity value of the surrounding environment is relatively high, the lighting unit 13000 may decrease the intensity of light emissions thereof, thus preventing a waste of power.

The control unit 14000 controls the motion sensor unit 1100, the illumination intensity sensor unit 12000, and the lighting unit 13000 overall. When the motion sensor unit 11000 senses the motion of the object to which the lighting system is attached, and outputs a signal to the control unit 14000, the control unit 14000 outputs an operation signal to the illumination intensity sensor unit 12000. The control unit 14000 receives an illumination intensity value measured by the illumination intensity sensor unit 12000 and determines whether to turn on (operate) the lighting unit 13000.

Figure 28:
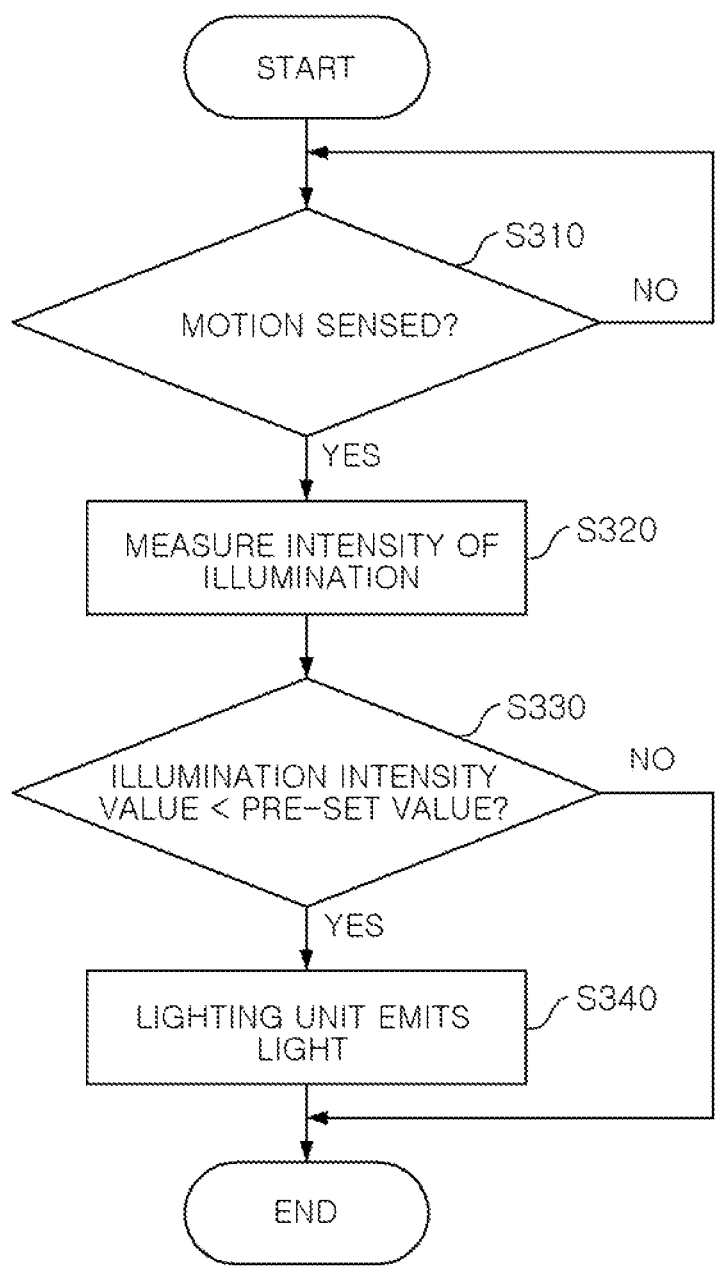
FIG. 28 is a flow chart illustrating a method for controlling a lighting system according to an embodiment of the present inventive concept.

FIG. 28 is a flowchart illustrating a method for controlling a lighting system. Hereinafter, a method for controlling a lighting system will be described with reference to FIG. 28.

First, a motion of an object to which the lighting system is attached is sensed and an operation signal is output (S310). For example, the motion sensor unit 11000 may sense a motion of a container or a vehicle in which the lighting system is installed, and when the motion of the container or the vehicle is sensed, the motion sensor unit 11000 outputs an operation signal. The operation signal may be a signal for activating overall power. Namely, when the motion of the container or the vehicle is sensed, the motion sensor unit 11000 outputs the operation signal to the control unit 14000.

Next, based on the operation signal, an intensity of illumination of a surrounding environment is measured and an illumination intensity value is output (S320). When the operation signal is applied to the control unit 14000, the control unit 14000 outputs a signal to the illumination intensity sensor unit 12000, and then the illumination intensity sensor unit 12000 measures the intensity of illumination of the surrounding environment. The illumination intensity sensor unit 12000 outputs the measured illumination intensity value of the surrounding environment to the control unit 14000. Thereafter, whether to turn on the lighting unit is determined according to the illumination intensity value and the lighting unit emits light according to the determination.

First, the illumination intensity value is compared with a pre-set value for a determination (S330). When the illumination intensity value is input to the control unit 14000, the control unit 14000 compares the received illumination intensity value with a stored pre-set value and determines whether the former is lower than the latter. Here, the pre-set value is a value for determining whether to turn on the lighting device. For example, the pre-set value may be an illumination intensity value at which a worker or a driver may have difficulty in recognizing an object with the naked eye or may make a mistake in a low-light situation, for example, a situation in which the sun starts to set.

When the illumination intensity value measured by the illumination intensity sensor unit 12000 is higher than the pre-set value, lighting of the lighting unit is not required, so the control unit 14000 shuts down the overall system.

Meanwhile, when the illumination intensity value measured by the illumination intensity sensor unit 12000 is lower than the pre-set value, lighting of the lighting unit is required, so the control unit 14000 outputs a signal to the lighting unit 13000 and the lighting unit 13000 emits light (S340).

Figure 29:
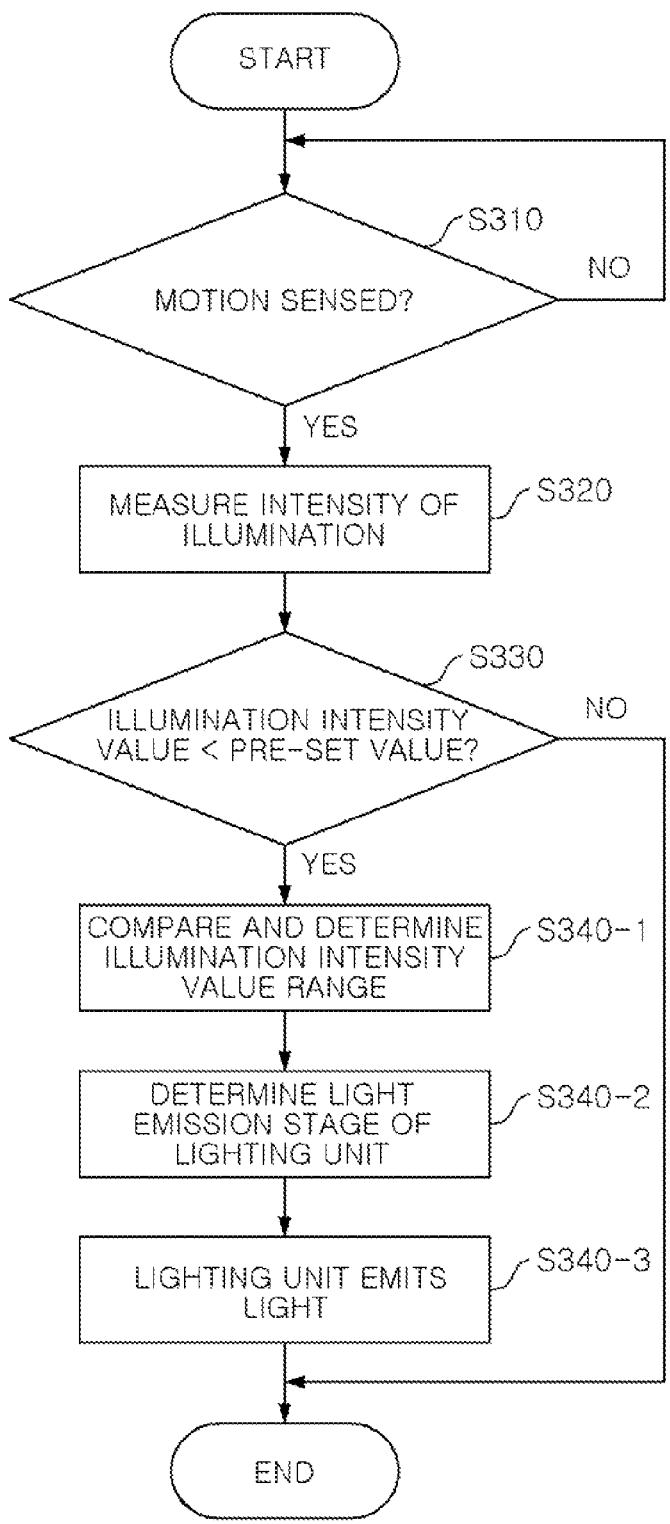
FIG. 29 is a flow chart illustrating a method for controlling a lighting system according to another embodiment of the present inventive concept.

FIG. 29 is a flowchart illustrating a method for controlling a lighting system according to another embodiment of the present inventive concept. Hereinafter, a method for controlling a lighting system according to another embodiment of the present inventive concept will be described. However, the same procedure as that of the method for controlling a lighting system as described above with reference to FIG. 28 will be omitted.

As illustrated in FIG. 29, in the case of the method for controlling a lighting system according to the present embodiment, an intensity of light emissions of the lighting unit may be regulated according to an illumination intensity value of a surrounding environment.

As described above, the illumination intensity sensor unit 12000 outputs an illumination intensity value to the control unit 14000 (S320). When the illumination intensity value is lower than a pre-set value (S330), the control unit 14000 determines a range of the illumination intensity value (S340-1). The control unit 14000 has a range of subdivided illumination intensity values, based on which the control unit 14000 determines the range of the measured illumination intensity value.

Next, when the range of the illumination intensity values is determined, the control unit 14000 determines an intensity of light emissions of the lighting unit (S340-2), and accordingly, the lighting unit 13000 emits light (S340-3). The intensity of light emissions of the lighting unit may be divided according to the illumination intensity value, and here, the illumination intensity value varies according to weather, time, and surrounding environment, so the intensity of light emissions of the lighting unit may also be regulated. By regulating the intensity of light emissions according to the range of the illumination intensity value, power waste may be prevented and a worker or an operator's attention may be drawn to their surroundings.

Figure 30:
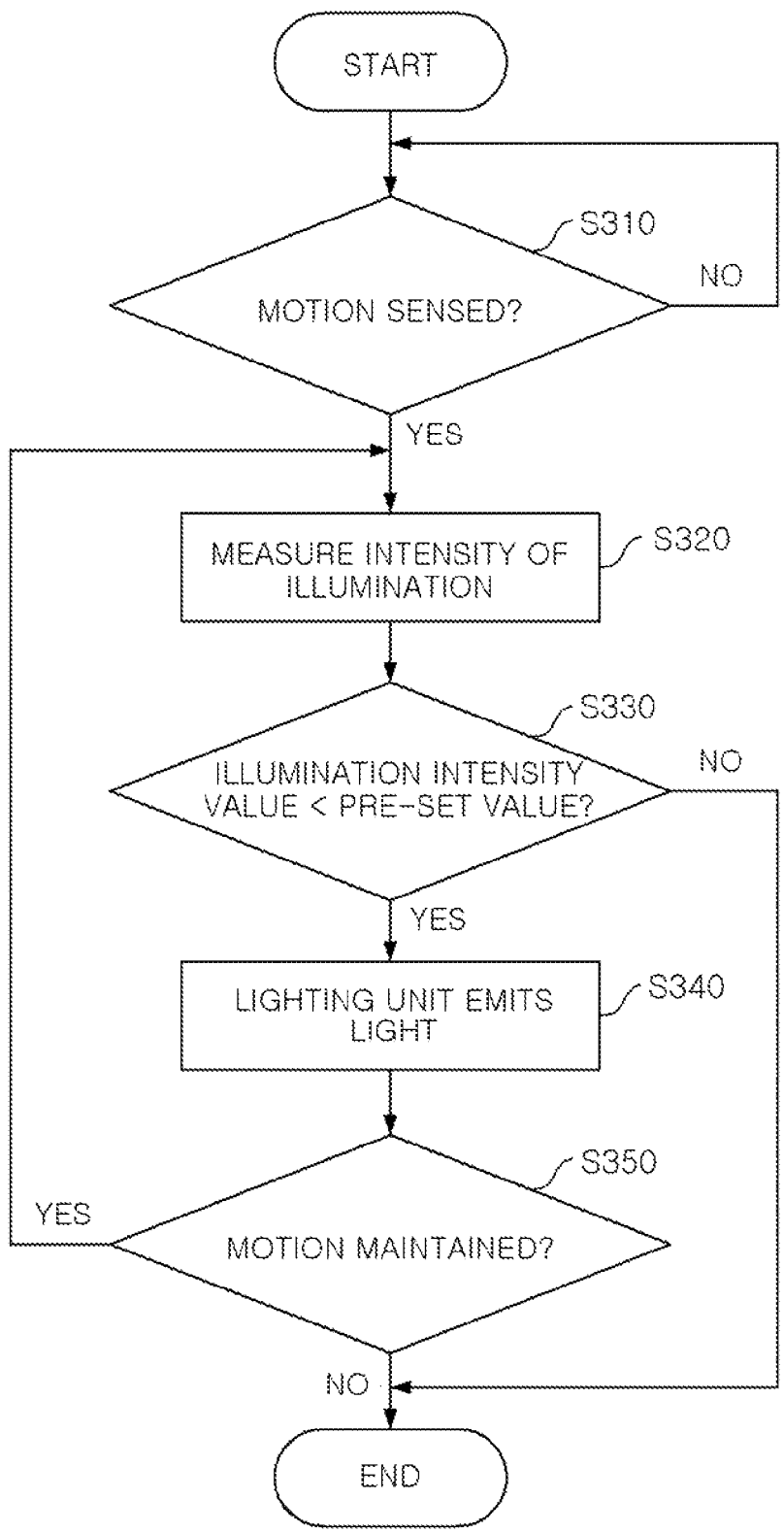
FIG. 30 is a flow chart illustrating a method for controlling a lighting system according to another embodiment of the present inventive concept.

FIG. 30 is a flowchart illustrating a method for controlling a lighting system according to another embodiment of the present inventive concept. Hereinafter, a method for controlling a lighting system according to another embodiment of the present inventive concept will be described. However, the same procedure as that of the method for controlling a lighting system as described above with reference to FIGS. 28 and 29 will be omitted.

The method for controlling a lighting system according to the present embodiment further includes operation S350 of determining whether a motion of an object to which the lighting system is attached is maintained in a state in which the lighting unit 13000 emits light, and determining whether to maintain light emissions.

First, when the lighting unit 13000 starts to emit light, termination of the light emissions may be determined based on whether a container or a vehicle to which the lighting system is installed moves. Here, when the motion of the container is stopped, it may be determined that an operation thereof has terminated. In addition, when a vehicle temporarily stops at a crosswalk, light emissions of the lighting unit may be stopped to prevent interference with the vision of oncoming drivers.

When the container or the vehicle moves again, the motion sensor unit 11000 operates and the lighting unit 14000 may start to emit light.

Whether to maintain light emissions may be determined based on whether a motion of an object to which the lighting system is attached is sensed by the motion sensor unit 11000. When the motion of the object is continuously sensed by the motion sensor unit 11000, an intensity of illumination is measured again and whether to maintain light emissions is determined. Meanwhile, when the motion of the object is not sensed, the system is terminated.

As set forth above, in the case of the method for manufacturing a light source module and a method for manufacturing an electronic component module according to embodiments of the present inventive concept, since the substrate unit is formed by bonding the flexible structure in a semi-cured state and heat dissipation structure through a heating and pressing operation, the light source module has excellent heat dissipation characteristics and can be mass-produced through a simple process.

In addition, since the heat dissipation structure is disposed only in portions, a flexible region can be maintained to enhance a degree of freedom of design.

Advantages and effects of the present inventive concept are not limited to the foregoing content and any other technical effects not mentioned herein may be easily understood by a person skilled in the art from the foregoing description.

While the present disclosure has been shown and described in connection with the embodiments, it will be apparent to those skilled in the art that modifications and variations can be made without departing from the spirit and scope of the invention as defined by the appended claims.

What is claimed is:

1. A method of making a light emitting device, the method comprising:
    attaching a conductive layer on a first surface of a flexible layer, the flexible layer being made of a resin and one from among a ceramic filler and a light-reflective filler, and being maintained in a semi-cured state;
    forming a solder resist layer on the conductive layer;
    attaching a first heat dissipation structure to a first region on a second surface opposite to the first surface of the flexible layer and attaching a second heat dissipation structure to a second region different from the first region, on the second surface of the flexible layer, the attached first and the attached second heat dissipation structures being in direct contact with the flexible layer thereby forming a flexible region provided between the first region and the second region and including at least a portion of the flexible layer; and
    heating and pressing to bond the flexible layer and the first and the second heat dissipation structures together,
    wherein the flexible region comprises one of a concave portion and a convex portion at a part of the flexible region adjoining one of the first and the second regions.

2. The method of claim 1, wherein in the heating and pressing, the flexible layer in the semi-cured state, is cured to bond the flexible layer and the heat dissipation structure together without using another layer or adhesive between the flexible layer and the heat dissipation structure.

3. The method of claim 2, wherein the heating and pressing comprises:
    heating to a temperature between 140° C. and 190° C.; and
    applying pressure between 5.5 kgf/cm² to 7.5 kgf/cm².

4. The method of claim 3, wherein the heating and applying pressure are applied for two to six hours to cure the semi-cured flexible layer.

5. The method of claim 4, wherein the temperature of the heating is between 140° C. and less than 180° C.

6. The method of claim 1, wherein the ceramic filler is 10% by weight of the flexible layer.

7. The method of claim 1, wherein the flexible layer has a thickness in a range from 0.1 micrometer to 0.15 micrometer.

8. The method of claim 1, wherein the flexible region comprises:
    the one of the concave portion and the convex portion at a first part of the flexible region adjoining the one of the first and the second regions; and
    the other of the concave portion and the convex portion at a second part different from the first part of the flexible region adjoining the other of the first and the second regions.

9. A method of making a light emitting device, the method comprising:
    attaching a conductive layer on an upper surface of a flexible layer, the flexible layer being made of a resin and one from among a ceramic filler and a light-reflective filler, and being maintained in a semi-cured state;
    forming a solder resist layer on the conductive layer;
    attaching a first heat dissipation structure to a one region on a lower surface of the flexible layer and attaching a second heat dissipation structure to another region on the lower surface of the flexible layer, the attached first and the attached second heat dissipation structures being in direct contact with the flexible layer; and
    heating and pressing to bond the flexible layer and the first and the second heat dissipation structures together,
    wherein a flexible region is disposed between the one and the another regions, and includes portions of the solder resist layer, the conductive layer, and the flexible layer, and
    wherein the flexible region is flexible to have one of a positive curvature and a negative curvature at a part of the flexible region adjoining the one region and to have another of the positive curvature and the negative curvature at a part of the flexible region adjoining the another region.

* * * * *